(12) United States Patent
Takai et al.

(10) Patent No.: US 7,135,906 B2
(45) Date of Patent: Nov. 14, 2006

(54) DELAY CIRCUIT AND DELAY SYNCHRONIZATION LOOP DEVICE

(75) Inventors: Yasuhiro Takai, Tokyo (JP); Shotaro Kobayashi, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 10/901,220

(22) Filed: Jul. 29, 2004

(65) Prior Publication Data

US 2005/0024107 A1      Feb. 3, 2005

(30) Foreign Application Priority Data

Jul. 31, 2003    (JP)    ............................. 2003-283709

(51) Int. Cl.
*H03H 11/26*    (2006.01)

(52) U.S. Cl. ...................... 327/263; 327/277

(58) Field of Classification Search ................ None
See application file for complete search history.

(56) References Cited

U.S. PATENT DOCUMENTS

| | | | | |
|---|---|---|---|---|
| 5,920,510 A | * | 7/1999 | Yukutake et al. | ...... 365/189.05 |
| 5,923,613 A | * | 7/1999 | Tien et al. | ................... 365/233 |
| 6,034,901 A | * | 3/2000 | Toda | ............................ 365/194 |
| 6,078,199 A | * | 6/2000 | Kim | ............................. 327/116 |
| 6,313,676 B1 | * | 11/2001 | Abe et al. | .................... 327/158 |
| 6,396,322 B1 | * | 5/2002 | Kim et al. | ................... 327/158 |
| 6,812,799 B1 | * | 11/2004 | Kirsch | .......................... 331/57 |
| 2001/0017558 A1 | * | 8/2001 | Hanzawa et al. | ........... 327/165 |

FOREIGN PATENT DOCUMENTS

| | | |
|---|---|---|
| JP | 2000-151372 A | 5/2000 |
| JP | 2002-158566 A | 5/2002 |
| JP | 2003-91331 A | 3/2003 |
| JP | 2003-101409 A | 4/2003 |

* cited by examiner

*Primary Examiner*—Timothy P. Callahan
*Assistant Examiner*—Cassandra Cox
(74) *Attorney, Agent, or Firm*—Sughrue Mion, PLLC

(57) ABSTRACT

A delay circuit includes a first delay line circuit having a plurality of stages of delay units, a second delay line circuit having a plurality of stages of delay units, a plurality of transfer circuits provided in association with respective stages of the delay units of the first delay line circuit, the transfer circuits controlling the transfer of the outputs of the delay units of the first delay line circuit to associated stages of the delay units of the second delay line circuit. The delay units of respective stages of the first delay line circuit inverting input signals. Each stage delay unit of the second delay line circuit includes a logic circuit receiving an output signal of the transfer circuit associated with the delay unit in question and an output signal of a preceding stage to send an output signal to a following stage. The duty ratio is rendered variable by independently selecting the rising edge of the input signal and a propagation path of the falling edge.

8 Claims, 23 Drawing Sheets

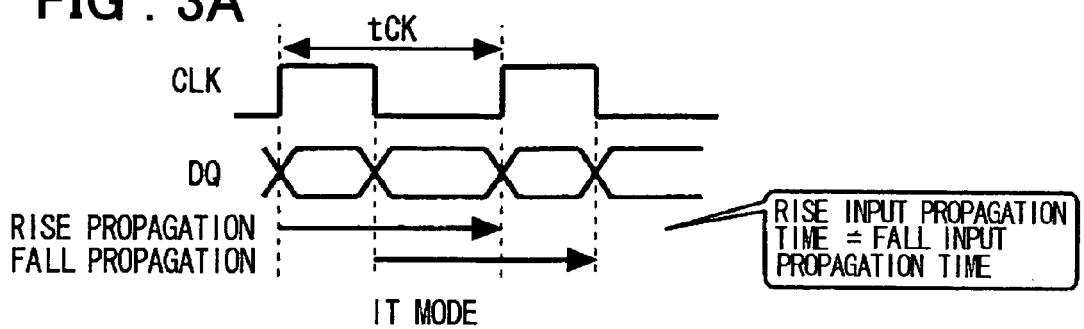
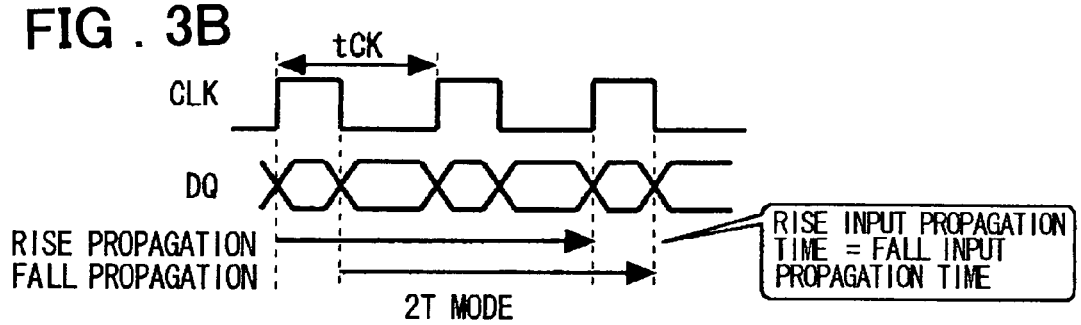
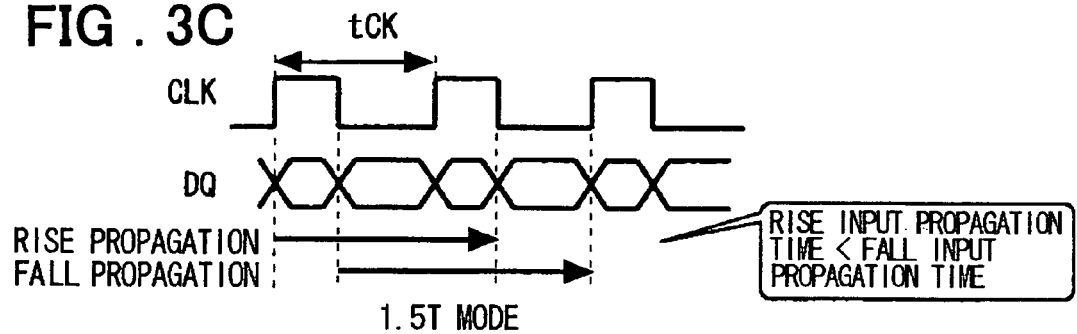

DELAY CIRCUIT AND DELAY SYNCHRONIZATION LOOP DEVICE

FIELD OF THE INVENTION

This invention relates to a delay circuit and, more particularly, to a delay circuit preferably applied to a delay locked loop (DLL).

BACKGROUND OF THE INVENTION

FIG. 21 schematically shows an illustrative structure of a DLL (delay lock loop) used e.g. in a conventional DDRII/I-SDRAM (Double Delta Rate II-Synchronous DRAM). Referring to FIG. 21, the DLL is made up by two control circuits and two coarse delay lines CDL 10 having a variable delay time. The control circuit is composed of a phase detector (P/D) 12, also termed a phase comparator, and a counter 13. An output of a receiver 11, which receives complementary clock signals CLK and CLKB, is supplied to the coarse delay line CDL 10, output pairs O0 and E0 of which are supplied to a fine delay line FDL 15, composed of a phase interpolator, for phase adjustment. A multiplexer 17 receives output data signals, not shown, in parallel, and selects and outputs the output data signal to a data terminal DQ, in synchronization with each of the rising edge and the falling edge of a clock signal CLK_0, output from the fine delay line FDL 15. Meanwhile, a reference numeral 17 in FIG. 21 collectively denotes a multiplexer (data multiplexer) for multiplexing input parallel data signals (read data) on a serial data signal, based on a clock signal CLK_0, and an output buffer for outputting data from a data output terminal DQ. A dummy circuit 18 is a dummy multiplexer for producing a delay equivalent to the delay time of the multiplexer 17 in the feedback route in the DLL circuit. The dummy circuit 18 outputs a feedback clock signal CLK_FDB which rises based on a rising edge of the clock signal CLK_0 and which falls based on a falling edge of the clock signal CLK_0. Meanwhile, an input of the phase detector (P/D) 12 may be an internal signal I0 and a dummy buffer of the delay time equivalent to that of the input buffer 11 may be provided between the dummy circuit 18 and the phase detector (P/D) 12. Alternatively, the feedback clock signal CLK_FDB may be delayed by the dummy circuit 18 by a delay value equivalent to the delay time of the input buffer 11.

The phase detector (P/D) 12 compares the phase of the feedback clock signal CLK_FDB, output from the dummy circuit 18, with the phase of the input signal CLK (e.g. phase of the rising edge), and counts the result of comparison from the phase detector (P/D) 12, with a counter 13, with the phase lead being UP and the phase delay being DOWN). A selection circuit 14 decodes the count result by the counter 13 to generate a control signal, used for variably setting the delay time in the coarse delay line CDL 10. Meanwhile, the phase interpolator of the fine delay line FDL 15 outputs an output signal of the phase (delay) prescribed by division of the phase difference (delay) of the inputs O0 and E0. It is noted that a pair of signals, entered to the phase interpolator, are represented by an even signal (E0 of FIG. 21) and an odd signal (O0 of FIG. 21).

In this DLL circuit, the propagation time of the data output DQ is synchronized with an integer number times one clock cycle time tCK of the input clock signal CLK. For example, if one clock period tCK is longer, as shown in FIG. 3A, the synchronization of the data DQ with the clock signal CLK is attained in one clock cycle (referred to as "1T mode").

If one clock period tCK is lesser than the intrinsic delay of the delay circuit (smallest delay time), as shown in FIG. 3B, the synchronization of the data DQ with the clock signal CLK is attained in two clock cycles (referred to as "2T mode").

In the DLL circuit, employing a CMOS delay circuit, the shorter the propagation time, the lesser become the timing variations relative to the variations in the power supply, that is, jitter. As for the timing variations, the following relation is valid:

(timing variations)∝(propagation time)×(level variations) and (level variations)∝(current consumption)

where P∝Q means that P is proportionate to B.

FIG. 23 is a diagram showing a structure of a conventional coarse delay line (CDL) used in the DLL circuit shown e.g. in FIG. 21. Meanwhile, as for the CDL, shown in FIG. 23, reference is made e.g. to the following Patent Publication 1. Referring to FIG. 23, the CDL includes a delay line circuit, composed of inverters 201, 202, . . . and 217, and first to eighth tristate inverters 221 to 228 which receive outputs of the odd-numbered stage inverters 201, 203, 205, . . . , and 215 respectively. Outputs of the first and third stage tristate inverters 221 and 223 are connected in common and supplied to the ninth tristate inverter 229. Outputs of the second and fourth stage tristate inverters 222 and 224 are connected in common and supplied to the tenth tristate inverter 230. Outputs of the fifth and seventh tri-state inverters 225 and 227 are connected in common and supplied to the eleventh tri-state inverter 231, while outputs of the sixth and eighth tri-state inverters 226 and 228 are connected in common and supplied to the twelfth tri-state inverter 232. Outputs of the ninth and eleventh tri-state inverters 229 and 231 are connected in common and supplied to the eleventh tri-state inverter 233, while outputs of the tenth and twelfth tri-state inverters 230 and 232 are connected in common and supplied to an inverter 234. The inverters 233 and 234 output an even output E0 and an odd output O0, respectively. The eleventh and twelfth tri-state inverters 231 and 232 have output control terminals for receiving the result of logical sum operations of RF_4 and RF_8 by an OR circuit 243 and the result of logical sum operations of RF_6 and RF_10 by an OR circuit 244 respectively, while the ninth and tenth tri-state inverters 229 and 230 have output control terminals for receiving the result of logical sum operations of RF_12 and RF_16 by an OR circuit 241 and the result of logical sum operations of RF_14 and RF_18 by an OR circuit 242 respectively.

Meanwhile, the specifications of e.g. the DDR (Double Data Rate)-II/I are such that the data output DQ is synchronized with both edges of a clock signal, and that the duty ratio of 45 to 55% is allowed for the input clock signal CLK. In order to make it possible to attain synchronization at the 1.5 clock cycle between the 1T mode and the 2T mode, it becomes necessary to independently set the delay time for the rise input and that for the fall input of the clock signals CLK in a DLL circuit or the like. However, in the conventional coarse delay line CDL, shown in FIGS. 21 and 23, it is not possible to set the rise or fall of the output clock signal independently from the rising edge and the falling edge of the input clock signal.

As a delay lock loop for independently setting the rise and falling edges of an output clock signal from the rise and falling edges of the input clock signal, respectively, there is known a configuration in which a coarse delay line CDL(R) $10_1$ for rising edge adjustment and a coarse delay line CDL(L) $10_2$ for falling edge adjustment, are provided, as shown for example in FIG. 22, and in which phase detectors $12_1$ and $12_2$ and counters $13_1$ and $13_2$ are also provided as the control circuit. Meanwhile, as for the structure in which a pair of coarse delay lines CDL are provided for the rising edge and the falling edge, reference is made to e.g. the following Patent Publication 2.

In FIG. 22, fine delay lines (FDL) $15_1$ and $15_2$ are provided in association with the coarse delay lines for rising edge adjustment CDL(R) $10_1$ and with the coarse delay lines for falling edge adjustment CDL(L) $10_2$, and there is provided a multiplexer circuit 16 for multiplexing two outputs of the fine delay lines (FDL) $15_1$ and $15_2$ into one signal. An output clock signal CLK_0 from the multiplexer circuit 16 is supplied to the data multiplexer 17 which outputs two data (readout data) per clock cycle from a data output terminal DQ, in synchronism with a rising edge and the falling edge of the clock signal CLK_0. Meanwhile, the reference numeral 17 in FIG. 22 indicates a data output route for e.g. the multiplexer and the output buffer.

[Patent Document 1]

Japanese Patent Kokai Publication No. JP-P2003-91331A (FIGS. 1 and 7)

[Patent Document 2]

Japanese Patent Kokai Publication No. JP-P2003-101409A (FIG. 20)

SUMMARY OF THE DISCLOSURE

In the DLL circuit, shown in FIG. 22, two rows of delay line circuits CDLs are needed for generating the different propagation time for the rise and the fall of the clock signal CLK. This circuit structure needs an area almost twice as large as that of that shown in FIG. 21, while the operating current (current consumption) is nearly doubled.

Moreover, in the DLL circuit, shown in FIG. 22, the timing of the rise and the fall of the output clock signal CLK_0 is determined on the basis of the rise and the fall of the input clock signal CLK, while there lacks the function of prescribing the timing of the rise and the fall of the output clock signal based on the fall and the rise of an input clock signal.

Accordingly, it is an object of the present invention to provide a simplified delay circuit, generating different propagation time for the signal rise and fall to suppress or reduce the increase in the circuit area or power consumption to realize low jitter and small area of the synchronous delay loop (DLL).

It is another object of the present invention to provide a synchronous delay loop circuit in which clock cycles needed for synchronization may be variably switched by a simplified circuit structure.

The above and other objects are attained by a delay circuit in accordance with one aspect of the present invention, comprising a first delay line circuit having a plurality of stages of delay units, a second delay line circuit having a plurality of stages of delay units, a plurality of transfer circuits provided in association with respective stages of the delay units of the first delay line circuit, the transfer circuits receiving outputs of the stages of the delay units of the first delay line circuit to control the transfer of the outputs of the delay units to associated stages of the delay units of the second delay line circuit, the delay units of respective stages of the first delay line circuit inverting input signals to the delay units and outputting the inverted signals, each stage delay unit of the second delay line circuit including a logic circuit receiving an output signal of the transfer circuit associated with the delay unit in question and an output signal of the delay unit preceding the delay unit in question and for outputting the result of logical operations on the input signals to a downstream side.

According to the present invention, an edge of an input signal, supplied to an input end of the first delay line circuit and propagated through the first delay line circuit, is supplied, through the transfer circuit selected by the input control signal, to one of the delay units forming the second delay line circuit which is associated with the selected transfer circuit. The edge being propagated from the delay unit through the second delay line circuit towards an output so as to be output from an output end of the second delay line circuit. An edge of the output signal from the output end of the second delay line circuit is delayed from the timing of the associated edge of the input signal by an amount prescribed by the number of stages of the first and second delay line circuits forming a propagation path determined by the selected transfer circuit and by the delay time of the transfer circuits.

According to the present invention, one of a plurality of the transfer circuits receiving outputs of odd-numbered stages of delay units of the first delay line circuit, is selected by a corresponding control signal. One of a plurality of transfer circuits receiving outputs of even-numbered stages of delay units of the first delay line circuit, is selected by a corresponding control signal. The rise timing and the fall timing of an output signal of the second delay line circuit are variably set with respect to the rising and fall of the signal supplied to the first delay line circuit.

A delay circuit in another aspect of the present invention comprises a delay line circuit including a plurality of stages of delay units, a first switch on/off controlled based on an input control signal, and a second switch connected to an output of the delay unit of the stage number corresponding to the control signal, and turned on at a time point when the transition edge of the rise or fall of the input signal supplied to the delay line circuit and propagated has traversed a number of stages corresponding to the selection control signal, with the second switch causing transition of a common node from one logic value to the other logic value through the first switch in the on-state, a signal generating circuit connected to the common node to generate a rising signal or a falling signal responsive to the transition of the common node, and a control circuit responsive to an input signal supplied to the delay line circuit to set the common node to the one logic value by the other transition, that is, the falling or rising, of the input signal. According to the present invention, one ends of a plurality of the second switches are connected to outputs of plural delay units of respective different stages of the delay line circuit so as to be on/off controlled are connected common to the common node, and the first switch receiving the control signal and on/off controlled, is provided across the power supply and the other end of each of the plural second switches.

According to the present invention, the delay unit of the delay line circuit may be formed by an inverter circuit, a series circuit composed of the second switches connected to outputs of the odd-numbered delay units and the first switches associated with the second switches may be connected to a first common node provided for odd-numbered stages, a series circuit composed of the second switches connected to the outputs of the even-numbered delay units and the first switches associated with the second switches may be connected to a second common node provided for even-numbered stages. The signal generating circuit may be provided for each of the first and second common nodes, and the delay of the rising and the delay of the output from the rising and fall of the input, respectively, may be variable.

Another delay synchronous loop (DLL) device according to the present invention includes a variable delay circuit receiving an input signal, variably delaying the rise timing and the fall timing of the input signal to output the resultant signal, a multiplexing circuit for outputting an output signal, the pulse width of which is determined by the rising and the fall of the signal delayed by the variable delay circuit, and a control circuit for comparing the rising phase and the falling phase of the input signal to the rising phase and the falling phase of the output signal to variably control the delay time of the variable delay circuit based on the result of phase comparison. The multiplexing circuit for switching between decision of the rise timing and the fall timing of the output signal based on the rise and the fall of a signal output from the variable delay circuit and decision of the rise timing and the fall timing of the output signal based on the fall and the rise of the signal output from the variable delay circuit, in accordance with the input mode decision signal. The control circuit varies the rise timing and the fall timing of the output signal in the variable delay circuit, based on the result of phase comparison of the rise of the input signal and the output signal and the fall of the input signal and the output signal, or varies the fall timing and the rise timing of the output signal in the variable delay circuit, based on the result of phase comparison of the rise of the input signal and the output signal and the fall of the input signal and the output signal, in accordance with the input mode decision signal.

A delay locked loop device for generating an internal clock signal synchronized with an input clock signal, according to the present invention, comprises:

a first phase detection circuit for comparing the rising phase of the input clock signal and the rising phase of the internal clock signal, a second phase detection circuit for comparing the falling phase of the input clock signal and the falling phase of the internal clock signal, first and second variable delay circuits having delays thereof varied by the results of phase comparison in the first and second phase detection circuits, the rising and fall of the internal clock signal, obtained on multiplexing outputs of the first and second variable delay circuits, being adjustable independently of each other, a mode decision circuit for determining the clock period and an initial delay value by comparison, a first selection circuit for selecting for control of which of the first and second variable delay circuits the result of phase comparison by the first and second variable delay circuits is to be used, and a second selection circuit for switching, in multiplexing signals output from the first and second variable delay circuits to generate the internal clock signal, between the use of the rise and the fall of signals output from the first and second variable delay circuits for the rising of the internal clock signal and the use of the rise and the fall of signals output from the first and second variable delay circuits for the fall of the internal clock signal, based on the result of mode decision.

A delay locked loop device for generating an internal clock signal synchronized with an input clock signal, according to the present invention, comprises:

a first phase detection circuit for comparing the phase of the rise of the input clock signal and the phase of the rising of the internal clock signal, a second phase detection circuit for comparing the phase of the fall of the input clock signal and the phase of the fall of the internal clock signal, first and second variable delay circuits, the delay of which is varied by the result of phase comparison in the first and second phase detection circuits, the rise and fall of the internal clock signal, obtained on multiplexing the outputs of the first and second variable delay circuits, being adjustable independently of each other, and a mode decision circuit for determining the clock period and an initial delay value by comparison. The first phase detection circuit includes changing means for comparing the phase of rising of the internal clock signals to the phase of fall of the input clock signal by the result of mode decision. The second phase detection circuit includes changing means for comparing the phase of falling of the internal clock signals to the phase of rising of the reference clock signal by the result of mode decision. There is provided means for inverting the phase of the internal clock by the result of mode decision.

In the delay locked loop device of the present invention, at least one of the first and second phase detectors may be formed by a circuit for detecting the duty ratio of the internal clock signal. Or, at least one of the first and second phase detectors may be formed by a circuit for detecting the duty ratio of the internal clock signal and a selector circuit controlled by the result of mode decision and the input duty ratio detection enable signal to select for control of which one of the first and second variable delay circuits the results of decision by the first and second phase detection circuits and by the duty ratio detection circuit are used.

The meritorious effects of the present invention are summarized as follows.

According to the present invention, low jitter and a small area may be realized in the development of the high-speed synchronous semiconductor device.

According to the present invention, switching between e.g. the 1T mode and the 1.5T mode is possible in the high speed synchronous semiconductor device, and an optimum synchronous mode may be realized, by a simplified structure, in accordance with the operating frequency.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 3A to C are timing diagrams for illustrating the operating mode of the DLL, where FIG. 3A shows a 1T mode, FIG. 3B shows a 2T mode and FIG. 3C shows a 1.5T mode.

PREFERRED EMBODIMENTS OF THE INVENTION

Figure 1:
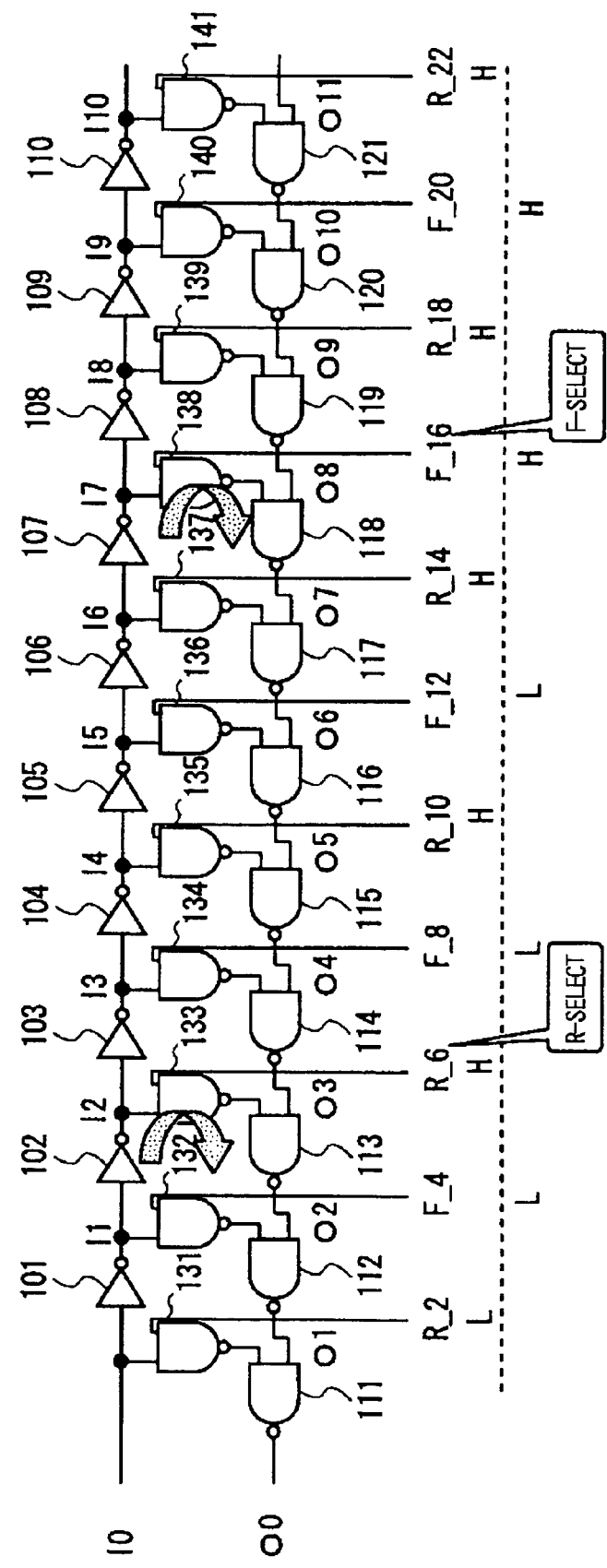
FIG. 1 is a diagram showing the configuration of an embodiment of a delay circuit according to the present invention.

The preferred mode for carrying out the present invention is now explained. The present invention comprises a delay line circuit in which the propagation path for the rising edge and that for the falling edge of an input signal are independently selected to provide for a variable duty ratio. By this delay line circuit, the DLL of, for example, x.5 mode (1.5T mode if x=1) may be realized.

That is, if a mode (1.5T mode) in which a data output DQ by the delay from the rising edge (CLK↑) is synchronized with the fall of the clock signal (CLK↓) (see "Rise propagation") and the delay of the data output DQ by the delay from the falling edge (CLK↓) is synchronized with the rise of the clock signal (CLK↑) (see "Fall propagation"), as shown in FIG. 3C, can be set, the (maximum) propagation time may be shortened to diminish the jitter.

More specifically, a delay circuit according to a preferred embodiment of the present invention includes a first delay line circuit having a plurality of stages of delay units (inverters 101, 102, 103, ..., 110, ...), a second delay line circuit having a plurality of stages of delay units (NANDS 111, 112, 113, ..., 110, ...), and a plurality of transfer circuits (131, 132, 133, ..., 141, ...) provided in association with respective stages of the delay units of the first delay line circuit. The transfer circuits performs control as to whether or not the transfer of the outputs (I1, I2, I3, ...) of the output delay units is to be made to associated stages of the delay units of the second delay line circuit. The delay units (111, 112, 113, ...) of the respective stages of the second delay line circuit receive outputs of the transfer circuits (131, 132, 133, ...) provided in association with respective stages of the delay units and outputs (O1, O2, O3, O4, ...) of the delay units (112, 113, 114, 115 ...) preceding to the delay units in question to send output signals to the following stage delay unit or output ends (O0).

One of a plurality of the transfer circuits (131, 133, 135, 137, ...) which respectively receive outputs (I0, I2, I4, I6, ...) of even-numbered stages of delay units of the first delay line circuit, is selected by a control signal (R_2, R_6, R_10, ...) associated with the transfer circuit. One of a plurality of transfer circuits (132, 134, 136, 138, ...), which respectively receive outputs (I1, I3, I5, I7, ...) of odd-numbered stages of delay units of the first delay line circuit, is selected by a control signal (F_4, F_8, F_12, ...) associated with the transfer circuit. The rise timing and the fall timing of an output signal O1 of the second delay line circuit are variably set with respect to the rising and fall of the signal I0 supplied to the first delay line circuit. The code of the set of control signals, supplied to the transfer circuits of the even-numbered and odd-numbered stages is preferably the thermometer code.

Figure 7:
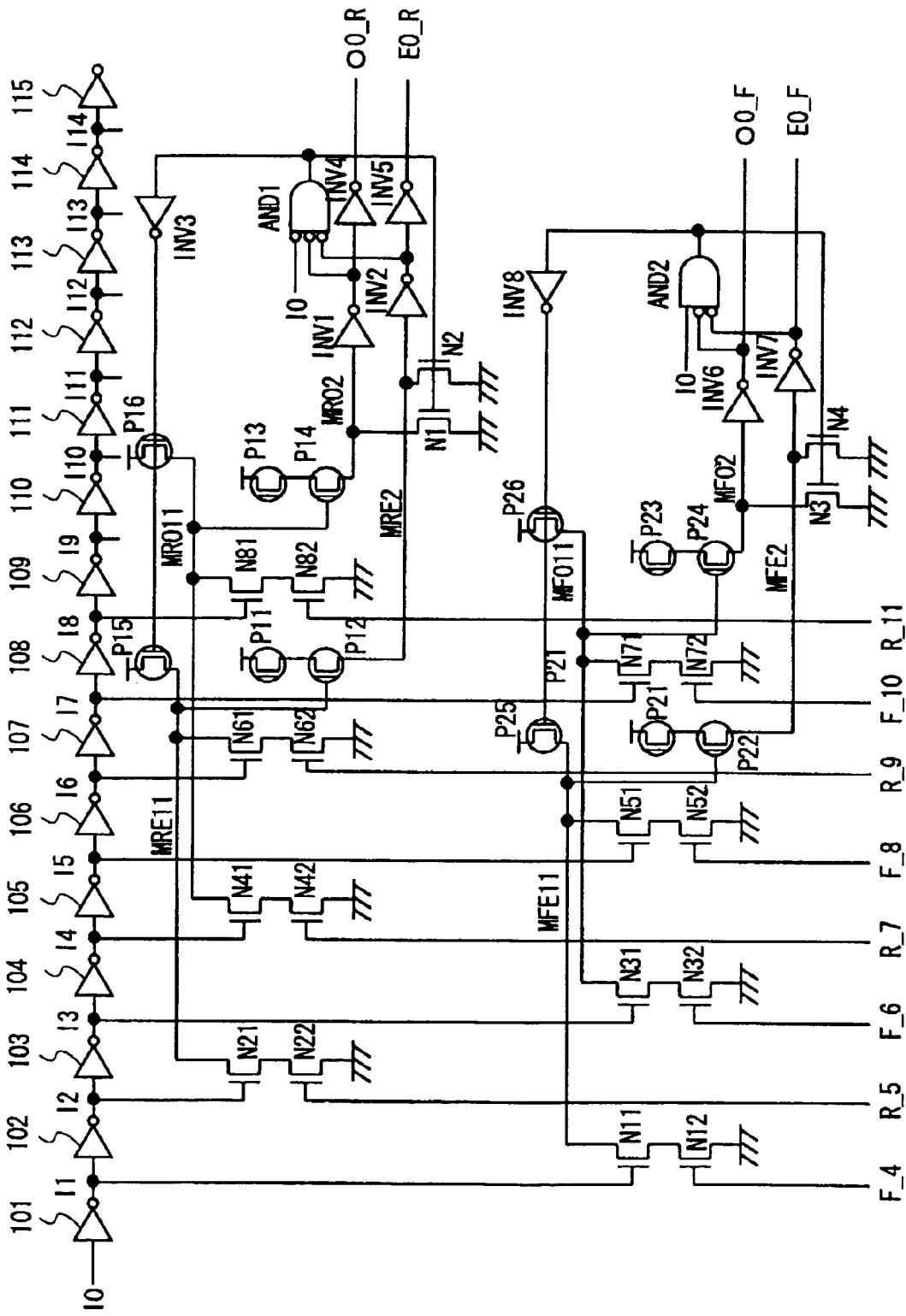
FIG. 7 is a diagram showing the configuration of still another embodiment of a delay line circuit (CDL) according to the present invention.

A modified embodiment of the present invention at least includes a delay circuit, having a plural number of stages of delay units, such as 111 to 115 of FIG. 7, a first switch which receives a selection control signal and is controlled to be on or off, such as N12 of FIG. 7, and a second switch, such as N11 of FIG. 7, which is connected to an output of a delay unit of the stage number in the delay units of the delay circuit, corresponding to the aforementioned selection control signal, and which is turned on at a time point one of the rise and falling edges of the input signal, supplied to and propagated through the delay circuit, has traversed the number of stages corresponding to the selection control signal, to set a common node, such as MFE 11 of FIG. 7, to a first logic value. The modified embodiment of the present invention also includes a signal generating circuit, which is composed by such as transistors P21, P22 and an inverter INV7 of FIG. 7, and generates a rise or falling edge signal responsive to transition of the common node from the first logic value to the second logic value, and a control circuit composed by such as AND2, inverter INV8 and transistor P25 of FIG. 7, which sets the common node to the original first logic value responsive to the other of the rise and falling edges of the input signal supplied to the delay circuit. In the present embodiment, one ends of the second set of switches such as N11 and N51 of FIG. 7, connected to outputs of plural delay units of respective different stages of the delay circuit, such as I1 and I5 of FIG. 7, are connected common to a common node, such as MFE 11 of FIG. 7, and a first set of switches, such as N12 and N52 of FIG. 7, which receives the selection control signal so as to be controlled on/off, are provided across the other ends of the second set of the switches and a power supply corresponding to the second logic value.

In the present embodiment, it is also possible for the delay circuit to have such a circuit configuration in which the delay units of the delay circuit are constituted by inverters, the second set of switches and the first set of the switches are connected common to the common nodes for odd-numbered stages (MFE11 and MFO 11), for the outputs of the delay units of the odd-numbered stages, the second set of switches and the first set of the switches are connected common to the common nodes for even-numbered stages (MRE11 and MRO 11), for the outputs of the delay units of the even-numbered stages, and delay of the rise and fall timing of the output are variably adjusted from the rise and fall timing of the input.

Figure 8:
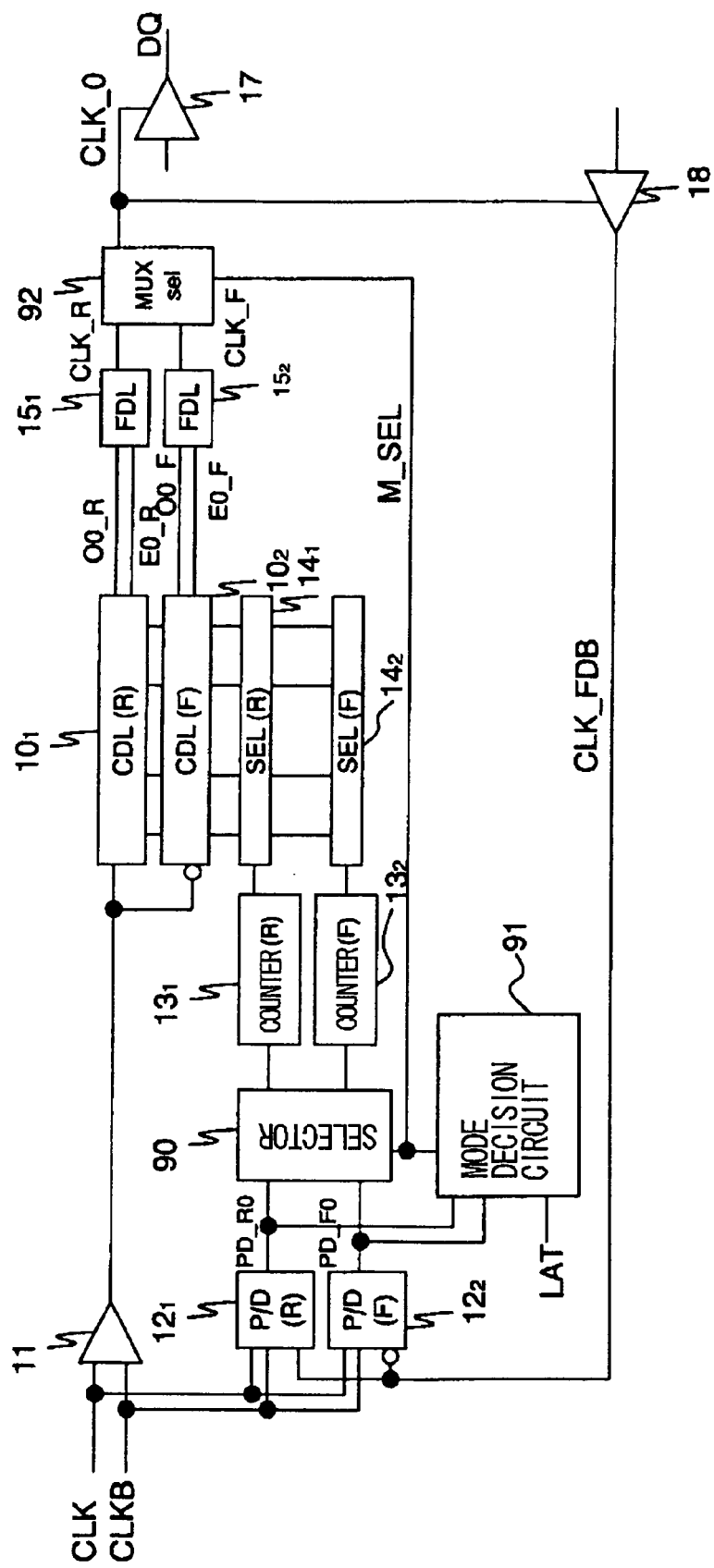
FIG. 8 is a diagram showing the configuration of a second embodiment of the DLL according to the present invention.

Referring to FIG. 8, a delay synchronous loop (DLL) device according to a preferred embodiment of the present invention includes a variable delay circuit (10) which receives an input signal and which variably delays the rise and fall timing of the input signal to output the resultant signal, a multiplexing circuit (92) for outputting an output signal the pulse width of which is prescribed by the rise and fall of the signal delayed by the variable delay circuit 10, and a control circuit (12 and 13) for comparing the rise phase and the fall phase of the input signal with the rise phase and the fall phase of the output signal to variably control the delay time of the variable delay circuit based on the result of the phase comparison. The multiplexing circuit (92) includes a circuit for switching between the decision of the rise timing and the fall timing of the output signal based on the rise and the fall of the signal output from the variable delay circuit and the decision of the rise timing and the fall timing of the output signal based on the fall and the rise of the signal output from the variable delay circuit, in accordance with the input mode decision signal. The control circuit varies the rise timing and the fall timing of the output signal in the variable delay circuit (10), based on the result of phase comparison of the rise of the input signal and the rise of the output signal CLK_FDB and between the rise of the input clock signal and the rise of the output signal, or varies the fall timing and the rise timing of the output signal in the variable delay circuit (10), based on the result of phase comparison of the rise of the input signal and the rise of the output signal CLK_FDB and between the fall of the input signal and the fall of the output signal.

Preferably, the present embodiment includes a mode decision circuit 91 for checking the operating mode, based on the result of phase comparison output from the phase detector, determining the value of the mode decision signal and outputting the so determined signal value.

Figure 14:
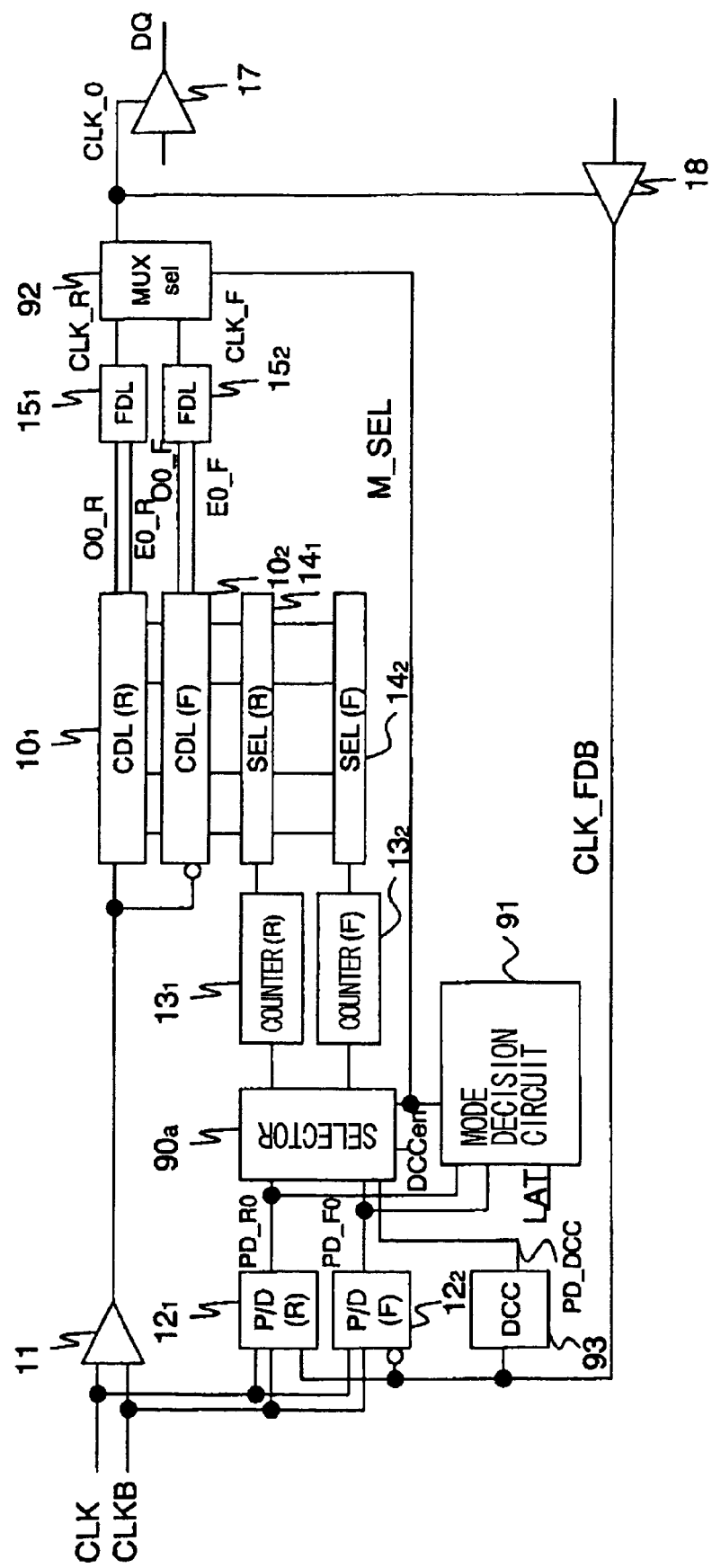
FIG. 14 is a diagram showing the configuration of a third embodiment of the DLL according to the present invention.

In a further embodiment of the present invention, shown in FIG. 14, there is provided a duty ratio detection circuit (93) for detecting the duty ratio of the feedback clock signal CLK_FDB in the DLL to output a duty ratio detection signal. The multiplexing circuit (92) switches between the decision of the rise timing and the fall timing of the output signal based on the rise and the fall of the signal output from the variable delay circuit (10), and the decision of the fall timing and the rise timing based on the fall and the rise of the signal output from the variable delay circuit (10), in accordance with the input mode decision signal M_SEL controlling the operating mode. The control circuit may also include a selector circuit (90*a*) for selecting two of the first result of phase comparison PD_R0 of the rise of the input clock signal CLK and the rise of the feedback clock signal CLK_FDB in the first phase detector (12$_1$), second result of phase comparison PD_F0 of the fall of the input clock signal CLK and the fall of the feedback clock signal CLK_FDB in the second phase detector (12$_2$) and the duty ratio detection enable signal, based on a duty ratio detection enable signal DCCen and the mode decision signal M_SEL, to vary the delay value of the rise timing and the fall timing of the output signal in the variable delay circuit (10). When the control signal DCCen is in the inactive state, the selector (90*a*) varies the delay value of the rise timing and the fall timing of the output signal in the variable delay circuit (10), in accordance with the first result of phase comparison PD_R0 and the second result of phase comparison PD_F0, or varies the delay value of the rise timing and the fall timing of the output signal in the variable delay circuit (10), in accordance with the second result of phase comparison PD_R0 and the first result of phase comparison PD_F0, based on the mode decision signal M_SEL. When the control signal DCCen is in the active state, the selector (90*a*) varies the delay value of the rise timing and the fall timing of the output signal in the variable delay circuit (10), in accordance with the first result of phase comparison PD_R0 and PD_DCC, or varies the delay value of the rise timing and the fall timing of the output signal in the variable delay circuit (10), in accordance with the PD_DCC and PD_R0, based on the mode decision signal M_SEL.

Figure 18:
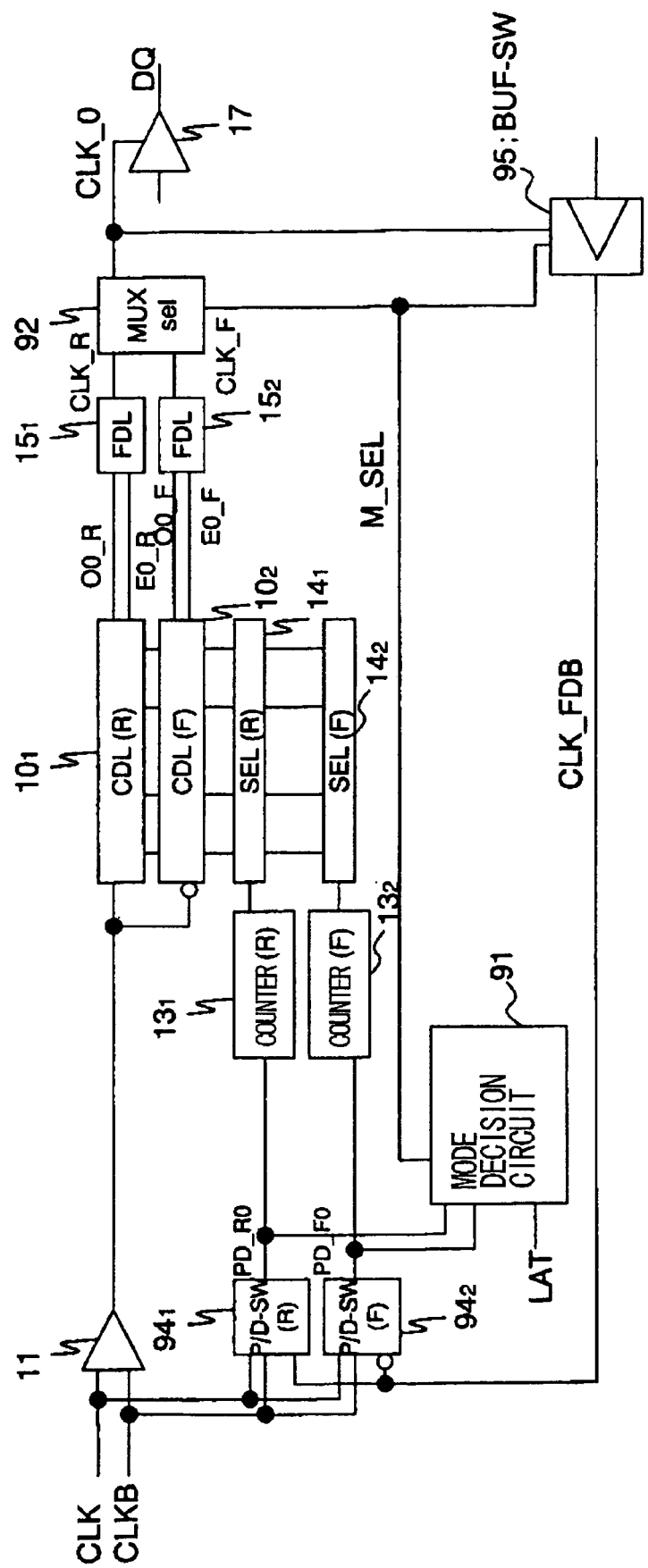
FIG. 18 is a diagram showing the configuration of a fifth embodiment of the DLL of the present invention.

A further embodiment of the present invention, shown in FIG. 18, includes a first delay circuit (10$_1$) having a variable delay time and outputting a signal corresponding to an input clock signal the rising of which has been delayed, a second delay circuit (10$_2$) having a variable delay time and outputting a signal corresponding to an input clock signal the falling of which has been delayed, a third delay circuit (15$_1$) receiving an output signal of the first delay circuit (10$_1$) and finely adjusting the phase of the signal to output the resultant signal, a fourth delay circuit (15$_2$) receiving an output signal of the second delay circuit (10$_2$) and finely adjusting the phase of the signal to output the resultant signal. The further embodiment also includes a multiplexing circuit (92) receiving and multiplexing an output signal of the third delay circuit and an output signal of the fourth delay circuit to output a sole output clock signal, in which the multiplexing circuit outputs, in accordance with an input mode decision signal M_SEL, an output clock signal CLK_0, the rise timing and the fall timing of which are prescribed based on the rising and the fall of the input clock signal, respectively, or an output clock signal CLK_0, the fall timing and the rise timing of which are prescribed based on the rising and the fall of the input clock signal, respectively. The present modification also includes a dummy circuit (95) for delay adjustment, for generating a feedback clock signal CLK_FDB in phase with the output clock signal and a feedback clock signal CLK_FDB antiphase to the output clock signal, based on the transition of the output clock signal CLK_0, and for selecting one of the feedback clock signals as the feedback clock signal CLK_FDB, based on the mode decision signal, a first phase detector (94$_1$) for comparing the phase of the rising edges of the input clock CLK and the feedback clock signal CLK_FDB to output a non-inverted result of phase comparison and an inverted result of phase comparison to output one of the non-inverted result of phase comparison and the inverted result of phase comparison as the first result of phase comparison PD_R0 based on the mode decision signal, a second phase detector (94$_2$) for comparing the phase of the falling edges of the input clock signal and the feedback clock signal to output a non-inverted result of phase comparison and an inverted result of phase comparison to output one of the non-inverted result of phase comparison and the inverted result of phase comparison as the second result of phase comparison PD_F0 based on the mode decision signal, a first counter ($13_1$) for counting the first result of phase comparison, a second counter ($13_2$) for counting the second result of phase comparison, a first selection circuit ($14_1$) for outputting a control signal for adjusting the rise timing in the first delay circuit and a second selection circuit ($14_2$) for outputting a control signal for adjusting the fall timing in the first delay circuit.

An embodiment of a delay circuit and an embodiment of a DLL circuit, according to the present invention, are hereinafter explained in detail.

EMBODIMENT OF THE INVENTION

FIG. 1 shows a structure of a delay circuit embodying the present invention. In this figure, I0 and O0 denote an input and an output, respectively, while R_2, R_6, R_10, R_14 and R_18 are rise control signals and F_4, F_8, F_12, F_16 and F_20 are fall control signals. Referring to FIG. 1, the delay circuit of the present embodiment includes a first delay line circuit, composed of plural cascaded inverters 101, 102, . . . , and 110, a second delay line circuit, composed of plural cascaded NAND circuits 111, 112, 113, . . . , and 121, and a set of transfer circuits, composed of plural NAND circuits 131 to 141.

Of the set of transfer circuits, the NAND circuits 131, 133, 135, 137, . . . have first input ends connected to even-numbered stage inputs I0, I2, I4, I6, . . . , of the first delay line circuit, respectively, while having second input ends connected to the rise control signals R_2, R_6, R_10, R_14, . . . , respectively, and having output ends connected to first input ends of the NAND circuits 111, 113, 115, 117, . . . of the second delay line circuit respectively. The second input ends of the NAND circuits 111, 113, 115, 117, . . . of the second delay line circuit are connected to outputs O1, O3, O5, O7, . . . of the preceding stage NAND circuits 112, 114, 116, 118, . . . , respectively.

The NAND circuits 132, 134, 136, 138, . . . have first input ends connected to odd-numbered stage outputs I1, I3, I5, I7, . . . , of the first delay line circuit, respectively, while having second input ends connected to the fall control signals F_4, F_8, F_12, F_16, . . . , and having output ends connected to first input ends of the NAND circuits 112, 114, 116, 118, . . . of the second delay line circuit respectively. The second input ends of the NAND circuits 112, 114, 116, 118, . . . of the second delay line circuit are connected to outputs O2, O4, O6, O8, . . . of the preceding stage NAND circuits 113, 115, 117, 119, . . . , respectively.

From output nodes I1, I3, I5, . . . (=I2×i+1, i=0, 2, 3, . . . ) of the odd-numbered stages, falling edges are selected by control signals F_(4xi+4) and supplied to corresponding stage NAND circuits of the second delay line circuit, while rising edges are selected by control signals R_(4xi+2) and supplied to corresponding NAND circuits of the second delay line circuit, so that the signal rise and the signal fall are multiplexed by the NAND circuits.

The control signals R_I (I=(4xi+2), i=0, 2, . . . ) for rising edges and the control signals F_J (J=(4xi+4), i=0, 2, . . . ) for falling edges may be set independently, while thermometer codes, that is, the selected control signal and the control signals downstream thereof are High, with the control signal ahead of the selected control signal is Low.

Figure 2:
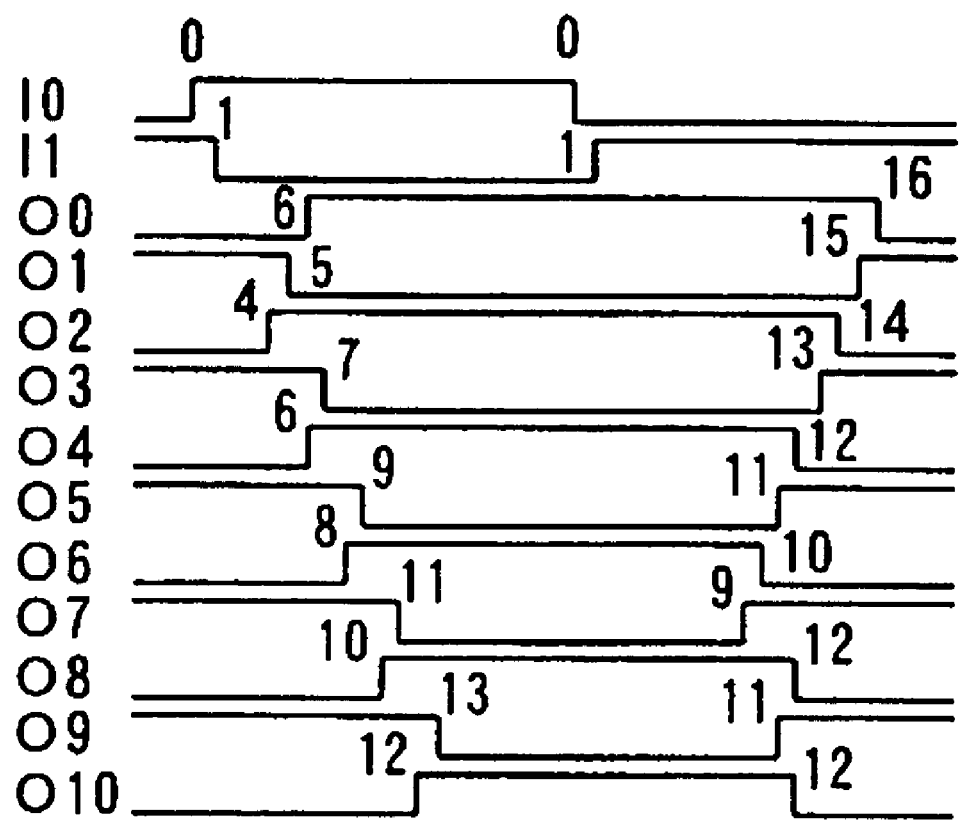
FIG. 2 is a timing diagram for illustrating the embodiment of the delay circuit according to the present invention.

In FIG. 1, if e.g. the transfer circuits for I2 and I7 of the first delay line circuit are selected (with R_2 being Low, R_6, R_10 and R_14_ . . . being High, F_4, F_8 and F_12 being Low and F_16, F_20, . . . being High), the outputs O0 to O10 of the respective delay units of the second delay line circuit are set to the rise timing and the fall timing shown in FIG. 2. The numbers affixed to the rising and falling edges of the operating waveform of FIG. 2 denote the numbers of stages of the gates as from the rise and fall of the input I0 (the number of gates of the first delay line circuit, transfer circuit and the second delay line circuit). Referring to FIGS. 1 and 2, the circuit operation of the present embodiment is explained.

In FIG. 1, a rising edge, supplied from the input I0, is inverted by the inverter 101 and becomes the falling edge (see fall '1' of I1 of FIG. 2), and is further inverted by the inverter 102 to become a rising edge. Since the control signal R_6 is High, the NAND circuit 133 is responsive to rising transition of the node 12 from Low to High to change its output from High to Low. The output O2 of the NAND circuit 113, forming the delay unit of the second delay line circuit, is responsive thereto and goes High from Low. That is, the output O2 rises with a delay of four delay time units as from the rising edge of the input I0 (see rise of O2 of FIG. 2 '4').

An output of the NAND circuit 132, which receives the control signal F_4 of Low level, is High, such that the output O1 of the NAND circuit 112 undergoes a transition from High to Low responsive to the transition of the output O2 from Low to High. The output O1 falls with a delay of five delay time units as from the rising edge of the input I0 (see fall of O1 of FIG. 2 '5').

An output of the NAND circuit 131 which receives the control signal R_2 of Low level, is High, such that the output O0 of the NAND circuit 111 undergoes a transition from Low to High responsive to the transition of the output O1 from High to Low. The output O0 rises with a delay of six delay time units as from the rising edge of the input I0 (see fall of O0 of FIG. 2 '6'). That is, the rising edge supplied from the input I0 to the first delay line circuit is sent to the output O0 with a delay of the sum of the delay time (2×td) for two stages of the delay elements (inverters) of the first delay line circuit, the delay time (td) of the transfer circuit 133 at the signal turning point and the delay time (3×td) for three stages of the delay elements (NANDs) of the second delay line circuit.

On the other hand, since the control signal R_10 is High, the NAND circuit 135, which receives the signal as input, has its output transferred from High to Low, responsive to rising transition from Low to High of the input I4, such that the output O4 of the NAND circuit 115 transfers from Low to High. The output 4 rises with a delay of six delay time units as from the rising edge of the input I0 (see rise of O4 of FIG. 2 '6').

Since the control signal F_8 is Low, the output of the NAND circuit 134 is High. The NAND circuit 114 is responsive to rising transition of the output O4 to cause transition of the output O3 from High to Low. That is, the output O3 falls with a delay of seven time units from the rising edge of the input I0 (see fall of O3 of FIG. 2 '7').

Similarly, the outputs O6, O8 and O10 of the second delay line circuit rise with a delay of 8, 10 and 12 delay time units as from the rising edge of the input I0, while the outputs O5, O7 and O9 of the second delay line circuit rise with a delay of 9, 11 and 13 delay time units as from the rising edge of the input I0 (see FIG. 2).

On the other hand, the falling edge supplied from the input I0 (see fall of I0 of FIG. 2 'O') is inverted by the inverter 101 to become a rising edge (see rising of I1 of FIG. 2 '1'). The rising edge is further inverted by the inverters 102 to 107 to become a rising edge at I7.

Since the control signal F_16 is High, the NAND circuit 138, supplied with the output I7, as input, is responsive to the rising transition of the output I7 from the Low level to the High level, and causes the transition of the output from the High level to the Low level. The output O7 of the NAND circuit 118 transfers from the Low level to the High level. The output O7 rises with a delay of 9 delay time units from the falling edge of the input I0 (see rising of O7 of FIG. 2 '9').

Since the control signal R_14 is High, the NAND circuit 137, supplied with the output I6, as input, is responsive to the falling transition of the output I6 from the High level to the Low level, to cause the transition of the output from the Low level to the High level. The output O6 of the NAND circuit 116 is responsive to transition of the output O7 from the Low level to the High level to transfer from the High level to the Low level. The output O6 falls to a Low level with a delay of ten delay time units from the falling edge of the input I0 (see falling of O6 of FIG. 2 '10').

Since the control signal F_12 is Low, the output of the NAND circuit 136, supplied with the output I5, as input, is Low1, such that the output O5 of the NAND circuit 116 is responsive to transition of the output O6 from the High level to the Low level to transfer from the Low level to the High level. That is, the output O5 rises to a High level with a delay of 11 delay time units from the falling edge of the input I0 (see falling of O5 of FIG. 2 '11').

Since the control signal R_10 is High, the NAND circuit 135, supplied with the output I4, as input, is responsive to the falling transition of the output I4 from the High level to the Low level, to cause the transition of the output from the Low level to the High level. The output O4 of the NAND circuit 115 transfers from the High level to the Low level responsive to transition of the output O5 from the Low level to the High level. The output O4 falls to a Low level with a delay of 12 delay time units from the falling edge of the input I0 (see falling of O4 of FIG. 2 '12').

In similar manner, the outputs O3 and O1 rise to a High level with a delay of 13 and 15 delay time units from the falling edge of the input I0. The outputs O2 and O0 fall to a Low level with a delay of 14 and 16 delay time units as from the falling edge of the input I0, respectively. That is, the falling edge supplied from the input I0 to the first delay line circuit is sent to the output O0 with a delay of the sum of the delay time (7×td) for seven stages of the delay elements (inverters) of the first delay line circuit, the delay time (td) of the transfer circuit 139 at the signal turning point and the delay time (8×td) for eight stages of the delay elements (NANDs) of the second delay line circuit, that is, with a delay of 16 delay time units (16×td).

Since the control signal F_20 is High, the NAND circuit 140, supplied with the output I9, as input, is responsive to the transition of the output I9 from the Low level to the High level, to cause the transition of the output from the High level to the Low level. The output O9 of the NAND circuit 120 transfers from the Low level to the High level. The output O9 rises with a delay of 11 delay time units from the falling edge of the input I0 (see rising of O9 of FIG. 2 '11').

Since the control signal R_18 is High, the NAND circuit 139, supplied with the output I8, as input, is responsive to the transition of the output I8 from the High level to the Low level, to cause the transition of the output from the Low level to the High level. The output O9 of the NAND circuit 119 is responsive to transition of the output O9 from the Low level to the High level to cause transition of the output O8 from the High level to the Low level. That is, the output O8 falls to the Low level with a delay of 12 delay time units from the falling edge of the input I0 (see rising of O8 of FIG. 2 '12').

Since the control signal R_22 is High, the NAND circuit 141, supplied with the output I10, as input, is responsive to the transition of the output I10 from the High level to the Low level, to cause the transition of the output from the Low level to the High level. The output O6 of the NAND circuit 116 is responsive to transition of the output O7 from the Low level to the High level, transfers from the High level to the Low level. The NAND circuit 121 receives an output of the NAND circuit 141 and O11 (fixed potential: High level) as inputs and, responsive to the falling of the output of the NAND circuit 141, causes the output O10 to fall from a High level to a Low level with a delay of 12 delay time units from the falling edge of the input I0 (see falling of O10 of FIG. 2 '12').

Thus, by selecting the rise control signal R_6 (that is, by setting R_2 to Low and by setting R_6, R_10, R_14, R_18 and R_22 to High) and by selecting the fall control signal R_16 (that is, by setting F_4, F_8 and F_12 to Low and by setting F_16 and F_20 to High), an output signal from O1 is such a signal in which the rising edge thereof is delayed by 6 delay time units from the rising of the input I0 and in which the falling edge thereof is delayed by 16 delay time units from the fall of the input I0.

Thus, by suitably varying the selection of the rise control signal (R_2, R_6, R_10, R_14, R_18 and R_22) and the fall control signals (F_4, F_8, F_12, F_16 and F_20), the delay time as from the rising of the input I0 until the rising of the signal from the output O0 and the delay time as from the fall of the input I0 until the fall of the signal from the output O0 may be varied independently of each other. That is, the pulse width and hence the duty ratio may be varied. Meanwhile, the number of stages of the delay units in the fist and second delay line circuits is arbitrary.

The delay circuit, shown in FIG. 1, realizes the 1.5T mode, by a simplified structure, and may be conveniently used in the DLL.

Figure 4:
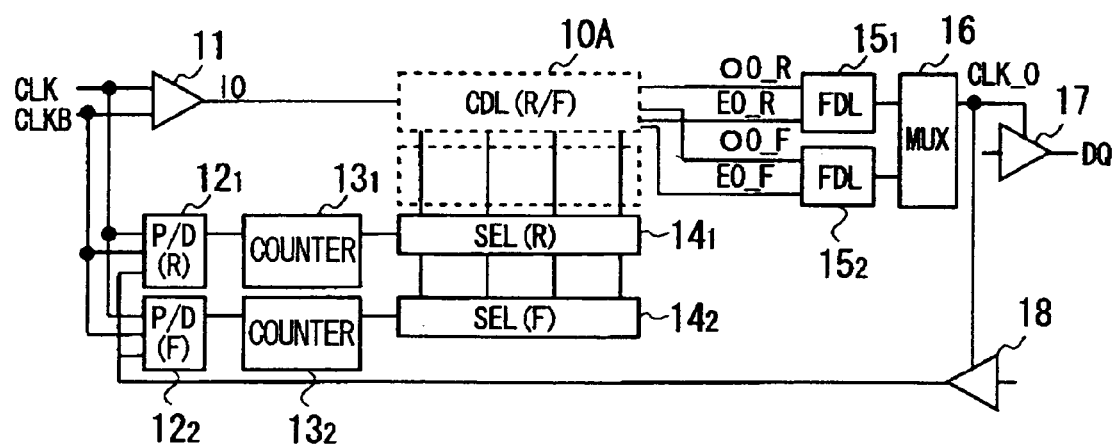
FIG. 4 is a diagram showing the configuration of an embodiment of the DLL according to the present invention.

FIG. 4 shows an illustrative structure of the DLL employing a delay circuit of the present embodiment. The DLL includes a first delay circuit 10A (CDL) which receives an input clock signal and which has variable delays of the rising edge and the falling edge of an output signal, a second delay circuit $15_1$ (FDL) which receives rising edges (O0_R and E0_R) of clock signals output from the first delay circuit 10A (CDL) to make fine adjustment of the output signal, and a third delay circuit $15_2$ (FDL) which receives falling edges (O0_F and E0_F) of clock signals output from the first delay circuit 10A (CDL) to make fine adjustment of the output signal. The DLL also includes a multiplexer 16 (MUX) which receives and multiplexes an output signal of the second delay circuit $15_1$ and an output signal of the third delay circuit $15_2$ and a multiplexer 17 (data multiplexer) which receives a clock signal CLK_0 from the multiplexer 16 (MUX) and converts read data input in parallel into serial data in synchronization with the rise and fall of the clock signal to output the resulting serial data to a data output terminal DQ. In FIG. 4, the reference numeral 17 denotes a data output path made up e.g. by a data multiplexer and an output buffer. The DLL also includes a dummy circuit 18 (dummy multiplexer) having a delay time equivalent to the delay time of the multiplexer 17, a first phase detector PD(R) $12_1$ which receives an input clock signal CLK and an output of the dummy circuit 18 and detects the phase difference of the rising edges of the two input signals, and a second phase detector PD(R) $12_2$ which receives an input clock signal CLK and an output of the dummy circuit 18 and detects the phase difference of the falling edges of the two input signals. The DLL also includes a first counter $13_1$ for performing up/down counting of the result of phase comparison (UP/DOWN) output from the first phase detector $12_1$ PD(R), a second counter $13_2$ for performing up/down counting of the result of phase comparison (UP/DOWN) output from the second phase detector $12_2$ PD(R), a first selection circuit $14_1$ SEL(R) for outputting a control signal for adjusting the rise timing in the first selection circuit 10A based on a count output of the first counter $13_1$ and a second selection circuit $14_2$ SEL(F) for outputting a control signal for adjusting the fall timing in the first selection circuit 10A based on a count output of the second counter $13_2$. The second delay circuit $15_1$ (FDL) may be composed by a known type of a phase interpolator for outputting an output signal of a phase corresponding to the division of a phase difference between rising edges of two signals (O0-R, E0-R). The third delay circuit $15_2$ (FDL) may be composed by a known type of a phase interpolator for outputting an output signal of a phase corresponding to the division of a phase difference between falling edges of two signals (O0-F, E0-F). As for a structure of the FDL, see e.g. FIG. 1 of the aforementioned Patent Publication 1. It is noted that a dummy circuit of a delay time equivalent to the delay of the input buffer 11 may be provided between the dummy circuit 18 and the inputs of the phase detectors $12_1$ and $12_2$.

In FIG. 4, the first delay circuit 10A (R/F) is composed by a delay circuit of the embodiment shown in FIG. 1. In the example in which e.g. the control signals R_6 and F_16 have been selected in FIG. 1, the propagation paths of the input I0 → output O0 of the rising edges and the falling edges of the input I0, expressed by the number of gate stages from the rise and fall of the input I0, in the operating waveform of FIG. 2, are of 6 and 16 stages, respectively. That is, the duty ratio can be variably set by varying the selected control signal.

Thus, in the DLL of this delay circuit, a data output from the data output terminal DQ by the rising edge of the clock signal CLK may be synchronized with the fall of the clock signal of the next cycle, while a data output from the data output terminal DQ by the falling edge of the clock signal CLK may be synchronized with the rise of the clock signal of the next cycle.

That is, the 1.5T mode of FIG. 3C may be realized with the sole delay circuit 10A. Meanwhile, not only the 1.5T mode but also x.5, where x is a number such that x>0, may also be realized in the present embodiment.

Figure 5:
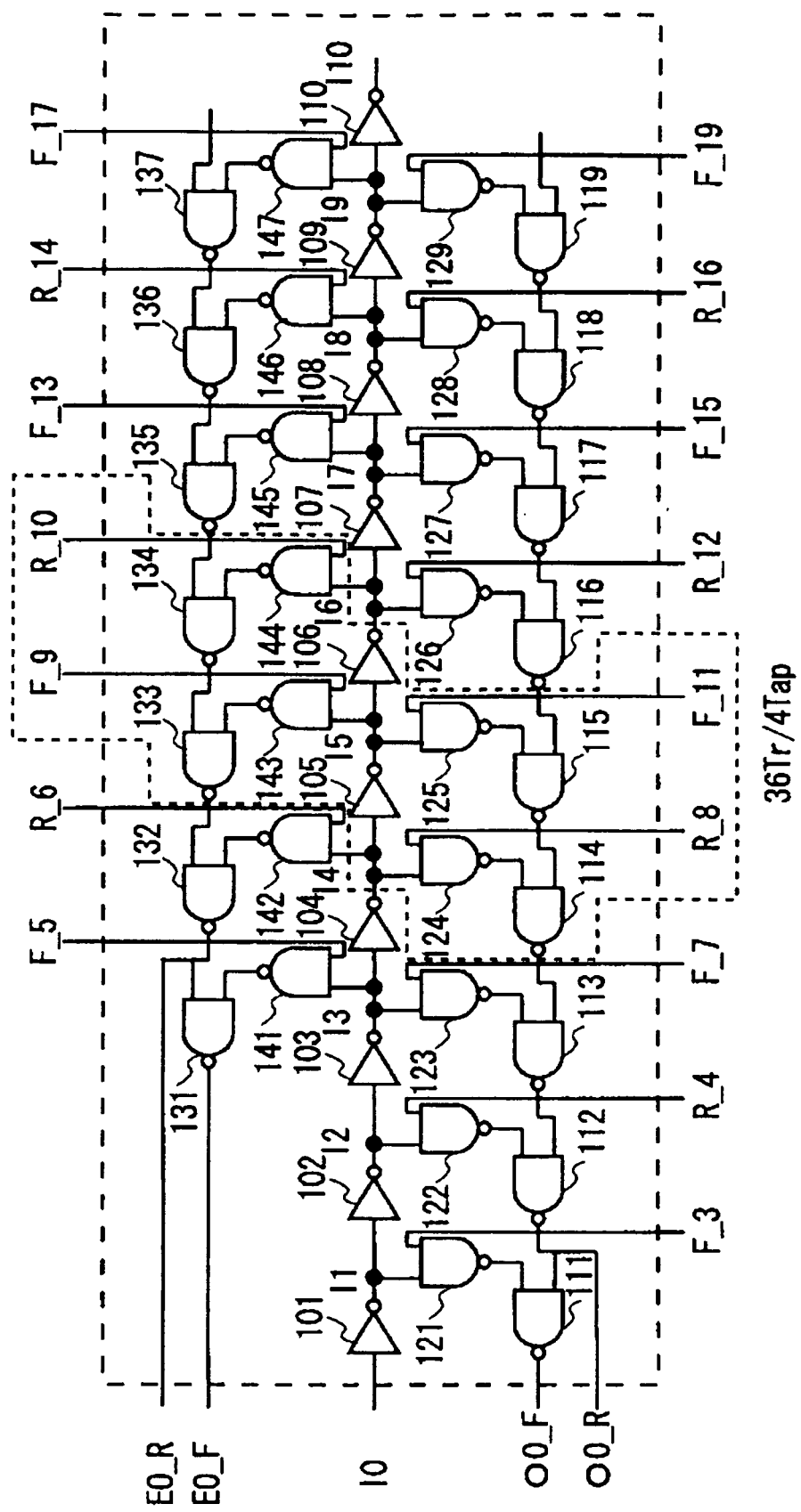
FIG. 5 is a diagram showing the configuration of an embodiment of a delay line circuit (CDL) according to the present invention.

For application to a high precision DLL by the FDL ($15_1$ and $15_2$ of FIG. 4) which interpolates the phase difference corresponding to two gate stages (two stages of inverters forming delay units of the delay circuit), two second delay line circuits of FIG. 1 are connected to the first delay line circuit made up by inverters 101 to 110, as shown in FIG. 5. In the present embodiment includes, as shown in FIG. 5, there are provided a first delay line circuit (101 to 110), having plural stages of the delay units (inverters), a first group of transfer circuits (121 to 129), a second delay line circuit (111 to 119) composed of plural delay units (NAND circuits), a second group of transfer circuits (141 to 147), and a third delay circuit (131 to 137) composed of plural delay units (NAND circuits). The number of stages of the delay unit in the respective delay circuits is arbitrary. The first group of transfer circuits (121 to 129) and the second group of transfer circuits (141 to 147) are alternately supplied with a fall control signal (F_J) and with a rise control signal (R_I), as in the circuit shown in FIG. 1. The second delay line circuit and the third delay circuit output signals (O0_R, O0_F and E0_R, E0_F) which rise and fall with a delay of gate stages prescribed by the selected control signal from the rising edge and the falling edge from the input I0. The delay circuit of FIG. 5 is applied to the delay circuit 10A shown in FIG. 4, such that the rising edges O0_R and E0-R and the falling edges O0_F and E0-F are entered to the FDLs $15_1$ and $15_2$ of FIG. 4, respectively. The structure shown in FIG. 5 is effective to simplify and reduce the size of the circuit. By independently selecting the propagation paths for the riding and falling edges, in the delay circuit shown in FIG. 5, the duty cycle may be made variable. Hence, the 1.5T mode may be realized to reduce the jitter without substantially increasing the area of the DLL delay circuit or the operating current. By the way, the circuit block surrounded by a broken line in FIG. 5 (two inverters of the first delay line circuit, two NANDs of the associated second and third delay circuits and two transfer circuits of each of the first and second groups of the transfer circuits) are made up by 36 transistors.

Figure 6:
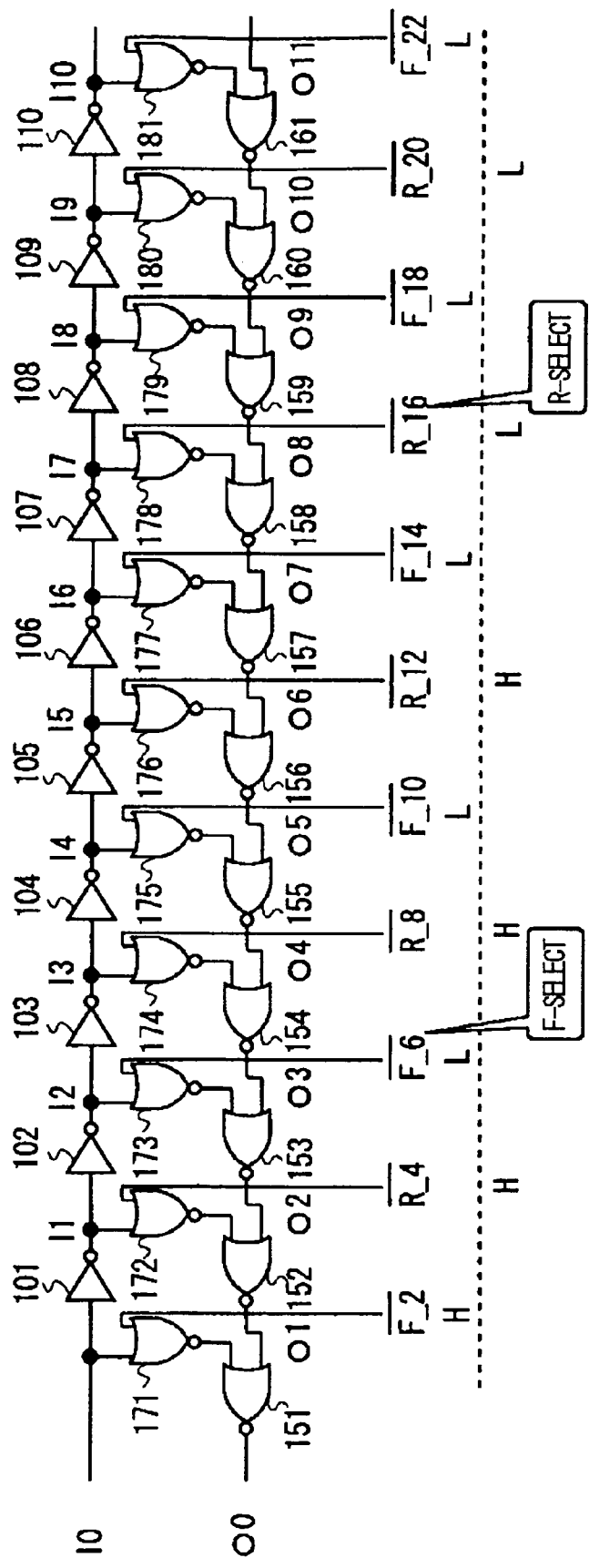
FIG. 6 is a diagram showing the configuration of another embodiment of a delay line circuit (CDL) according to the present invention.

FIG. 6 shows the circuit configuration according to a further embodiment of the present invention. In the circuit shown in FIG. 6, the NAND circuits 131 to 141 of the first group of transfer circuits of FIG. 1 are composed by NOR circuits 171 to 181 and the NAND circuits 111 to 121 of the second group of transfer circuits are composed by NOR circuits 151 to 161. The rise control signals /R_2, /R_6, /R_10, /R_14 and /R_18 and the fall control signals /F_4, /F_8, /F_12, /F_16 and /F_20 are all active at a Low level. The operation of the delay circuit, shown in FIG. 6, is basically the same as that shown in FIG. 1.

Another embodiment of the present invention is hereinafter explained. FIG. 7 shows the configuration of the other embodiment of a coarse delay line (CDL) according to the present invention. Referring to FIG. 7, the coarse delay line (CDL) includes a multiplexer which receives signals of preset inverter stages of the delay circuit composed of a plural number of inverter delay element stages and which selects an edge at a selected inverter stage number of the inverter stages, out of the edges propagated in the delay circuit, based on the input selection control signal, to output the so selected edge. Meanwhile, the structure shown in FIG. 7 outputs the rising edges O0_R and E0_R and the falling edges O0_F and E0_F, as inputs to the FDLs $15_1$ and $15_2$ of FIG. 4. The rise control signals /R_5, /R_7, /R_9, /R_11, . . . and the fall control signals /F_4, /F_6, /F_8 and /F_10, forming selection control signals for the multiplexer, are formed by binary codes. From the outputs of the odd inverter stages 11, 13, 15, 17, . . . of the first delay line circuit, formed by the inverter files 101 to 115, selection is made independently (separately) by the control signal F_j and outputs of the even inverter stages 12, 14, 16, . . . by R_i.

Referring to FIG. 7, the delay circuit CDL according to the present embodiment includes a sole delay circuit having plural stages of inverter files 101 to 105. A Nch transistor N11 which has a gate connected to an output I1 of the delay circuit and which is controlled to be turned on or off, and a Nch transistor N12 which has a gate supplied with a control signal F_4 and which is controlled to be turned on or off, are connected in series across the ground and a common node MFE 11, whilst a Nch transistor 51 which has a gate connected to the input I5 and which is controlled to be turned on or off, and a Nch transistor N52 which has a gate supplied with the control signal F_8 and which is controlled to be turned on or off, are connected in series across the ground and the common node MFE 11. A Nch transistor N31 which has a gate connected to an output I3 and which is controlled to be turned on or off, and a Nch transistor N32 which has a gate supplied with a control signal F_6 and which is controlled to be turned on or off, are connected in series across the ground and a common node MFO 11, whilst a Nch transistor 71 which has a gate connected to the output I7 and which is controlled to be turned on or off, and a Nch transistor N72 which has a gate supplied with the control signal F_10 and which is controlled to be turned on or off, are connected in series across the ground and the common node MFO 11. There is also provided a Pch transistor P22 which has a source connected to the power supply via Pch transistor P21 in the on-state, and has a gate connected to the common node MFE 11. The Pch transistor P22 has a drain connected to a common node MFE 2, and an inverter INV7 which has an input connected to the common node MFE2 and outputs an even falling signal E0_F.

There is also provided a Pch transistor P24 which has a source connected to the power supply via Pch transistor P23 in the on-state and has a gate connected to the common node MFO11. The Pch transistor P24 has a drain connected to the common node MFO2, and an inverter INV6 which has an input connected to the common node MFO2 and outputs an odd falling signal O0_F.

There is provided a second AND circuit (AND2) having inputs connected to outputs of inverters INV6, INV7 and the signal I0.

Pch transistors P25 and P26 are provided between the power supply and the common nodes MFE11 and MFO11. An output of the AND2 is inverted by an inverter INV8 and supplied to the gates of the Nch transistors N3 and N4.

There are provided Nch transistors N3 and N4 across the common node MFE2 and the ground and across the common node MFO2 and the ground, respectively. An output of the AND2 is supplied to the gates of the Nch transistors N3 and N4.

If the input I0 falls from the High level to the Low level and subsequently rises from the Low level to the High level, an output of AND2 goes High to turn on the Nch transistors N3 and N4 to charge the common nodes MFE 11 and MFO 11 and to discharge the common nodes MFE 2 and MFO 2. The above is the circuit for fall control. The rise control circuit is now explained.

A Nch transistor 21 which has a gate connected to an even number stage output I2 of the delay circuit and which is controlled to be on or off, is connected in series across the ground and the common node MRE 11, whilst a Nch transistor 61 which has a gate connected to the input I6 and which is controlled to be on or off, and a Nch transistor 62 which has a gate supplied with the control signal R_9 and which is controlled to be on or off, are connected in series across the ground and the common node MRE 11. A Nch transistor 41 which has a gate connected to the output I4 and which is controlled to be on or off, and a Nch transistor 42, which has a gate supplied with the control signal R_7 and which is controlled to be on or off, are connected across the ground and the common node MRO 11, whilst a Nch transistor 81 which has a gate connected to the output I8 and which is controlled to be on or off, and a Nch transistor 82 which has a gate supplied with the control signal R_11 and which is controlled to be on or off, are connected in series across the ground and the common node MRO 11.

There is provided a Pch transistor P12 which has a source connected to the power supply via Pch transistor P1 in the on state and having a gate connected to the common node MRE11. The drain of the Pch transistor P12 is connected to the common node MRE2. An even rising signal E0_R is output from an inverter INV5, inverting the output of an inverter INV2 which has an input connected to the common node MRE 2.

There is provided a Pch transistor P14 which has a source connected to the power supply via Pch transistor P13 in the on-state, and also has a gate connected to the common node MRO 11. The drain of the Pch transistor P14 is connected to the common node MRO 2, and an odd rising signal O0_R is output from an inverter INV5 which inverts an output of an inverter INV1 which has an input connected to the common node MRO2t.

There is provided a first AND circuit (AND1) having inputs connected to outputs of the inverters INV1 and INV2 and the input I0.

There are provided Pch transistors P15 and P16 across the power supply and the common nodes MRE 11 and MRO 11. An output of the AND1 is inverted by inverter INV3 and supplied to the gates of the Pch transistors P15 and P16.

There are provided Nch transistors N1 and N2 across the common node MRE 2 and the ground and across the common node MRO2 and the ground, respectively, An output of the AND1 is supplied to the gates of the Nch transistors N1 and N2.

At a time point when the input I0, which, after rising from the Low level to the High level, has fallen to the Low level, the output of the AND1 goes High to turn on the Nch transistors N1 and N2 and the Pch transistors P15 and P16 to charge the common nodes MRE 11 and MRO 11 as well as to discharge the common nodes MRE2 and MRO2. The above is the explanation on the fall control circuit.

Although not shown, the structure downstream of the output I9 of the delay circuit is such that connection is made via switch to the common nodes MFE11 and MFO11 via switch through a series circuit of transistors having gates connected to outputs of every fourth odd inverter stage and a transistor having a gate coupled to a control signal. Similarly, the structure downstream of the output I10 of the delay circuit is such that connection is made via switch to the common nodes MFE11 and MFO11 through a series circuit of transistors having gates connected to outputs of every four odd inverter stage and a transistor having a gate coupled to a control signal.

An example of the operation of the delay circuit, shown in FIG. 7, is now explained. If, with the control signal R_5 High, the rising edge of the input I0 is propagated through the delay circuit, the common node MRE 11 is discharged, at a time point when the rising edge is propagated through two inverter stages 101 and 102 in the delay circuit, through the Nch transistor N21, the gate of which is supplied with the input I2, and Nch transistor N22, the gate of which is supplied with the high level control signal R_5. This turns on the Pch transistor P12, the gate of which is supplied with the voltage of the node MRE 11, such that the common node MRE 2 is charged to the power supply potential VDD, inverted by the inverter INV2 to a Low level, and again inverted by the inverter INV5 to a High level to give the rise E0_R of an even output. In similar manner, the rise O0_R of the odd output is output from the inverter INV4 by selecting one of the control signals R_7 to R_11. Then, by the fall of the input I0 during the same clock cycle, an output of AND1 goes High to turn on the Pch transistor P15, thus re-charging the common node MRE 11 and re-discharging the node MRE2.

If, with the control signal F_9 High, the falling edge of the input I0 is propagated through the delay circuit, the common node MFE 11 is discharged, at a time point when the falling edge is propagated through 7 inverter stages 101 to 107 in the delay circuit, through the Nch transistor N71, the gate of which is supplied with the falling edge of the output I7, and the Nch transistor N72, the gate of which is supplied with the control signal F_10 in the High level. This turns on the Pch transistor P22, the gate of which is supplied with the voltage of the node MFE11, such that the common node MFE2 is charged to the power supply potential VDD, and is inverted by the inverter INV7 to a Low level, to give the rise E0_F of an even output. In similar manner, the falling edge O0_F of the odd output is output from the inverter INV6 by selecting one of the control signal F_6 and F_10. Then, by the rising of the input I0 during the same clock cycle, the output of AND2 goes High to turn on the Pch transistors P25 and P26 to re-charge the common node MFE 11 to the power supply voltage VDD as well as to re-discharge the node MFE 2 to the ground potential. In this manner, the duty ratio may be varied by varying the phase of the rise time.

With the present embodiment, described above, the rising phase and the fall phase of the output signal may be varied independently of each other to vary the duty ratio.

In FIG. 7, the circuit structure for generating a signal supplied to the FDL of FIG. 4 is taken as an example for explanation. It is noted that each one of the rising edges and the falling edges may be selected. In such case, the circuit structure is such a one in which the signal E0_R and the signal E0_F, for example, are output.

By employing the delay circuits of the above-described embodiments as the delay circuit 10A of FIG. 4, the 1.5T mode can be realized. That is, the above circuit helps reduce the current consumption as well as the chip area of the semiconductor memory devices, such as DDRII/I-SDRAM.

By supplying reference clock signals from e.g. a source frequency synthesizer (PLL) to the input I0 of the delay circuit of each of the above-described embodiments, and by varying the timing of the transition edge of the clock, the frequency can be changed instantaneously to realize frequency modulation. The above-described embodiments may, of course, be used as a variety of signal generating apparatus for variably setting the fall time with respect to the reference signal.

Figure 22:
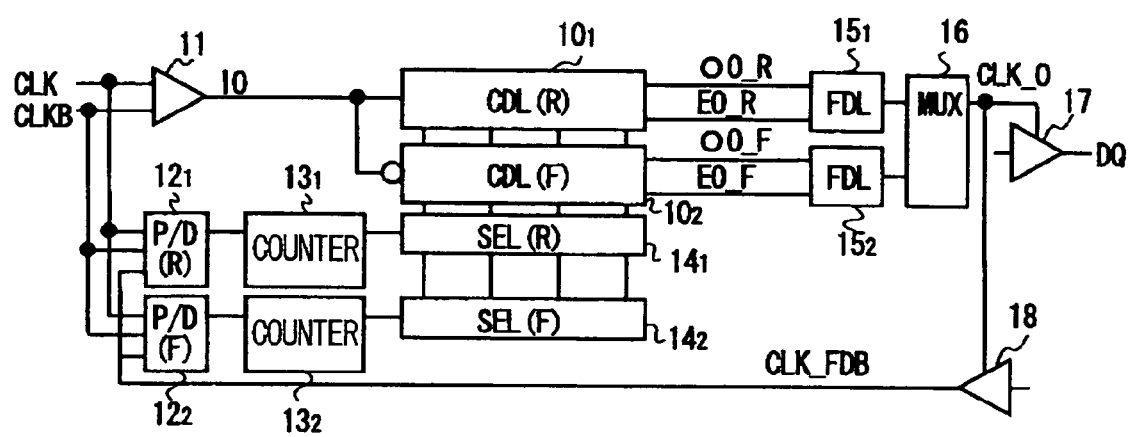
FIG. 22 is a diagram showing the configuration of the conventional DLL.
Figure 23:
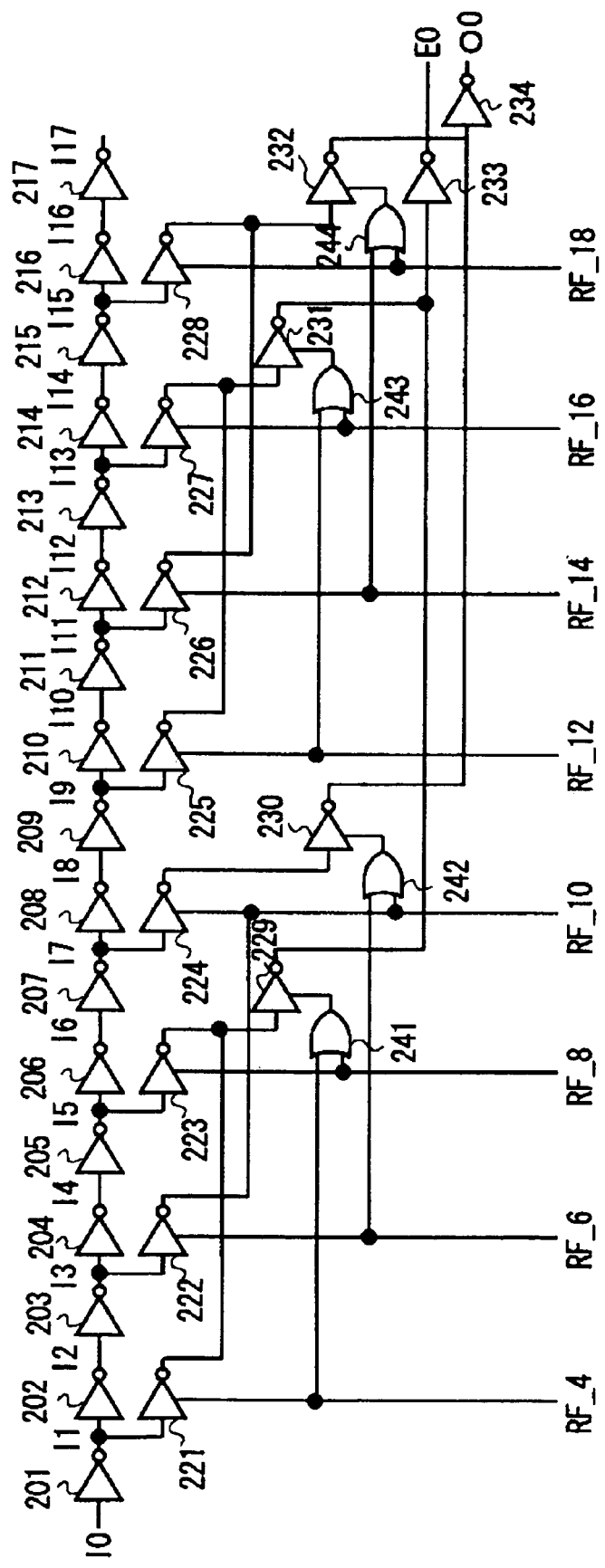
FIG. 23 is a diagram showing the configuration of a conventional delay line circuit.

FIG. 8 shows the configuration of a further embodiment of the present invention. The components which are the same as those shown in FIG. 22 are indicated by the same reference numerals. The elements which are the same as those of the conventional DLL circuit shown in FIG. 22 are not explained here in order to avoid redundancy.

A first phase detector P/D(R) 12$_1$ compares the phase of the rising edge of the input clock signal CLK with the phase of the rising edge of the feedback clock signal CLK_FDB of the DLL circuit, also termed 'internal clock signal', and outputs a first phase comparison result signal PD_R0 to a selector 90.

A second first phase detector P/D(F) 12$_2$ compares the phase of the falling edge of the input clock signal CLK with the phase of the falling edge of the feedback clock signal CLK_FDB, and outputs a second phase comparison result signal PD_F0 to the selector 90.

The selector 90 receives a mode decision signal M_SEL, output from a mode decision circuit 91, as a switching control signal, and determines to which of first and second counters 13$_1$ and 13$_2$ the first phase comparison result signal PD_R0 is to be supplied. The selector 90 also manages control to send the second phase comparison result signal PD_F0 to the counter different from the counter supplied with the first phase comparison result signal PD_R0.

The mode decision circuit 91 takes in the first phase comparison result signal PD_R0 and/or the second phase comparison result signal PD_F0, based on an input mode latch signal LAT, and decides on the operating mode, based on one or the combination of the two signals, to output the mode decision signal M_SEL In the present embodiment, the 1.5T mode and 1T mode are realized when the mode decision signal M_SEL is High and Low, respectively.

The first CDL15$_1$ delays the rising edge of the clock signal, output from the buffer 11, by delay time determined by the control signal, and outputs a pair of signals O0_R and E0_R rising with different phase for the duration of unit phases, such as, foe example, for two inverter stages. The second CDL15$_2$ delays the falling edge of the clock signal, output from the buffer 11, by delay time determined by the control signal, and outputs a pair of signals O0_F and E0_F rising with different phase for the duration of unit phases, such as, for example, for two inverter stages.

A multiplexer circuit 92 includes a multiplexer, not shown, and a selection circuit, also not shown, for multiplexing a signal CLK_R output from the first CDL15$_1$ and a signal CLK_F output from the second CDL15$_2$, to a sole clock signal. The selection circuit manages control to switch between input signal edges, prescribing the rising edge and the falling edge of the clock signal CLK_0, based on the input mode decision signal M_SEL. That is, the rise timing of the clock signal CLK_0 is determined by the transition of one of the signals CLK_R and CLK_0, as selected by the selection circuit, based on the mode decision signal M_SEL, while the fall timing of the clock signal CLK_0 is determined by the transition of the other of the signals CLK_R and CLK_0.

Figure 9:
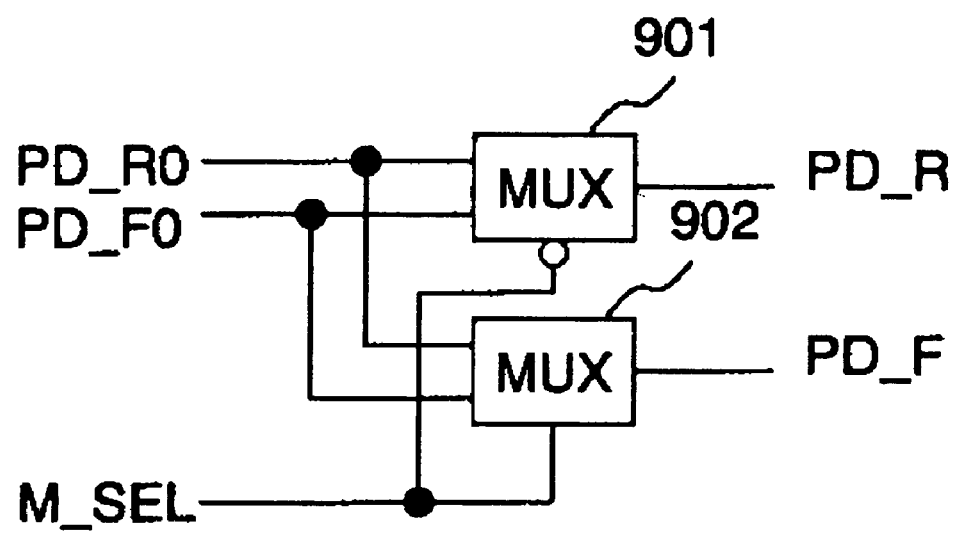
FIG. 9 is a diagram showing the configuration of a selector in the second embodiment of the DLL according to the present invention.

A configuration of the selector 90, multiplexer circuit 92 and the mode decision circuit 91 of FIG. 9 is hereinafter explained.

FIG. 9 shows an illustrative structure of the selector 90 including multiplexers 901 and 902 each having first and second input terminals for receiving the first phase comparison result signal PD_R0 and the second phase comparison result signal PD_F0. When the mode decision signal M_SEL is Low, the multiplexer 901 selects and outputs the first phase comparison result signal PD_R0, supplied to the first input terminal thereof, as an output signal PD_R, while the multiplexer 902 selects and outputs the second phase comparison result signal PD_F0, supplied to the second input terminal thereof, as an output signal PD_F. When the mode decision signal M_SEL is High, the multiplexer 901 selects and outputs the second phase comparison result signal PD_F0, supplied to the second input terminal thereof, as an output signal PD_R, while the multiplexer 902 selects and outputs the first phase comparison result signal PD_R0, supplied to the first input terminal thereof, as an output signal PD_F.

Figure 10:
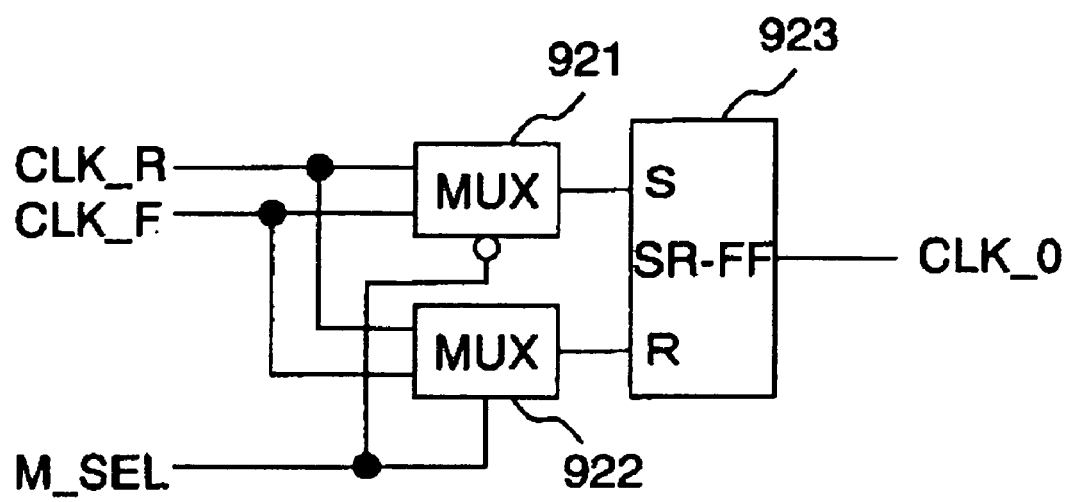
FIG. 10 is a diagram showing the configuration a multiplexer in the second embodiment of the DLL according to the present invention.

FIG. 10 shows the configuration of the multiplexer circuit 92. Referring to FIG. 10, the multiplexer circuit 92 includes two multiplexers 921 and 922, each including first and second input terminals for receiving the signal CLK_R output from the first CDL15$_1$ d and the signal CLK_F output from the first CDL15$_2$, and an SR flip-flop 923 which has a set terminal connected to an output of the multiplexer 921 and a reset terminal connected to an output of the multiplexer 922.

With the mode decision signal M_SEL Low, the multiplexer 921 selects and outputs the signal CLK_R supplied to the first input terminal, while the multiplexer 922 selects and outputs the signal CLK_F supplied to the second input terminal. The SR flip-flop 923 is set by the rising edge of the output of the multiplexer 921 to provide for the High level of the output CLK_0, while being reset by the rising edge of the output of the multiplexer 922 to provide for the Low level of the output CLK_0.

That is, the multiplexer circuit 92 outputs a clock pulse signal CLK_0 having the rise and fall prescribed by the rise of the signals CLK_R and CLK_F.

When the mode decision signal M_SEL is High, the multiplexer 921 selects and outputs the signal CLK_F, input to the second input terminal thereof, while the multiplexer 922 selects and outputs the signal CLK_R, input to the first input terminal thereof. The SR flip-flop 923 is set by the rising of the output from the multiplexer 921 (rising of the signal CLK_F) to provide for a High level of the signal CLK_0, while being reset by the rising of the output from the multiplexer 922 (rising of the signal CLK_R) to provide for a Low level of the signal CLK_0. That is, the multiplexer circuit 92 outputs a clock signal CLK_0, the rising and fall of which are prescribed by the rise of the signal CLK_F (a signal corresponding to the input clock signal CLK the fall of which has been delayed) and by the rise of the signal CLK_R (a signal corresponding to the input clock signal CLK the rise of which has been delayed).

As described above, the multiplexer circuit 92 switches between a mode (1T mode) which, when the mode decision signal M_SEL is Low, generates the rising of the output signal CLK_0 from the rise of the CLK_R output from the first CDL15$_1$ (hence from the rise of the input clock signal CLK), while generating the fall of the output signal CLK_0 from the rise of the signal CLK_F output from the second CDL15$_2$ (hence from the fall of the input clock signal CLK), and a mode (1.5T mode) which, when the mode decision signal M_SEL is High, generates the fall of the output signal CLK_0 from the rise of the CLK_R output from the first CDL15$_1$ (hence from the rise of the input clock signal CLK), while generating the fall of the output signal CLK_0 from the fall of the signal CLK_F output from the second CDL15$_2$ (hence from the fall of the input clock signal CLK).

Figure 11:
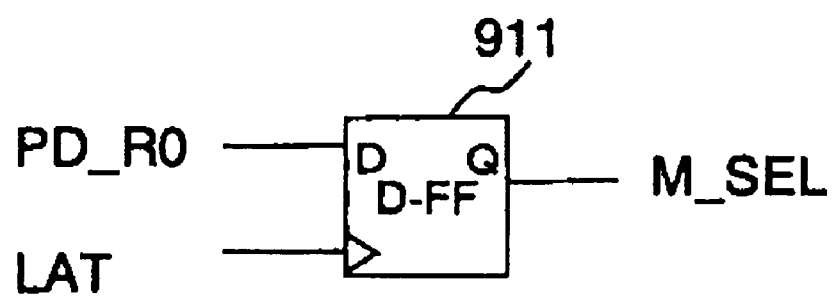
FIG. 11 is a diagram showing the configuration of a mode decision circuit in the second embodiment of the DLL according to the present invention.

FIG. 11 shows the configuration of the mode decision circuit 91 including a D type flip-flop 911. The first phase comparison result signal PD_R0 is sampled by the rise of a mode latch signal LAT and output as the mode decision signal M_SEL. For the mode latch signal LAT, a one-shot pulse, generated by e.g. a power-on-reset circuit, provided outside of the DLL circuit, on power up of the device, or during the initializing operation, such as on resetting.

Figure 12:
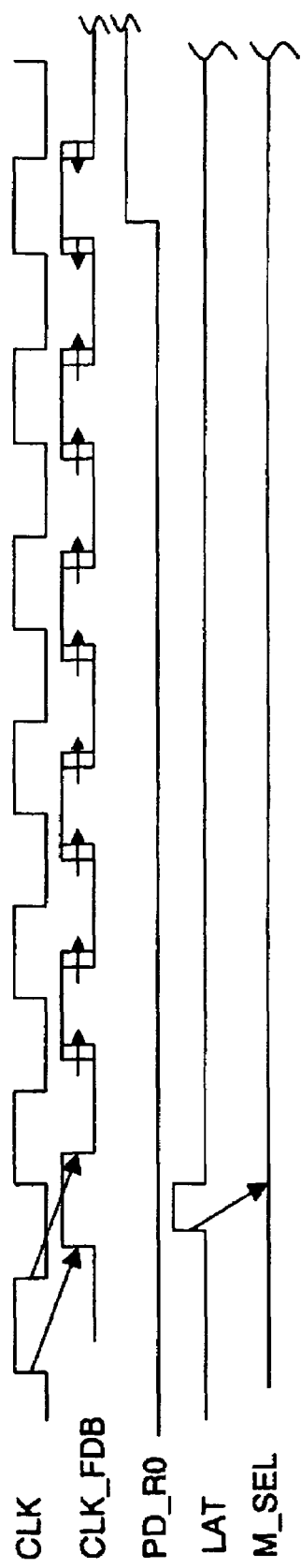
FIG. 12 is a timing diagram for illustrating the operation of the 1T mode in the second embodiment of the DLL according to the present invention.
Figure 13:
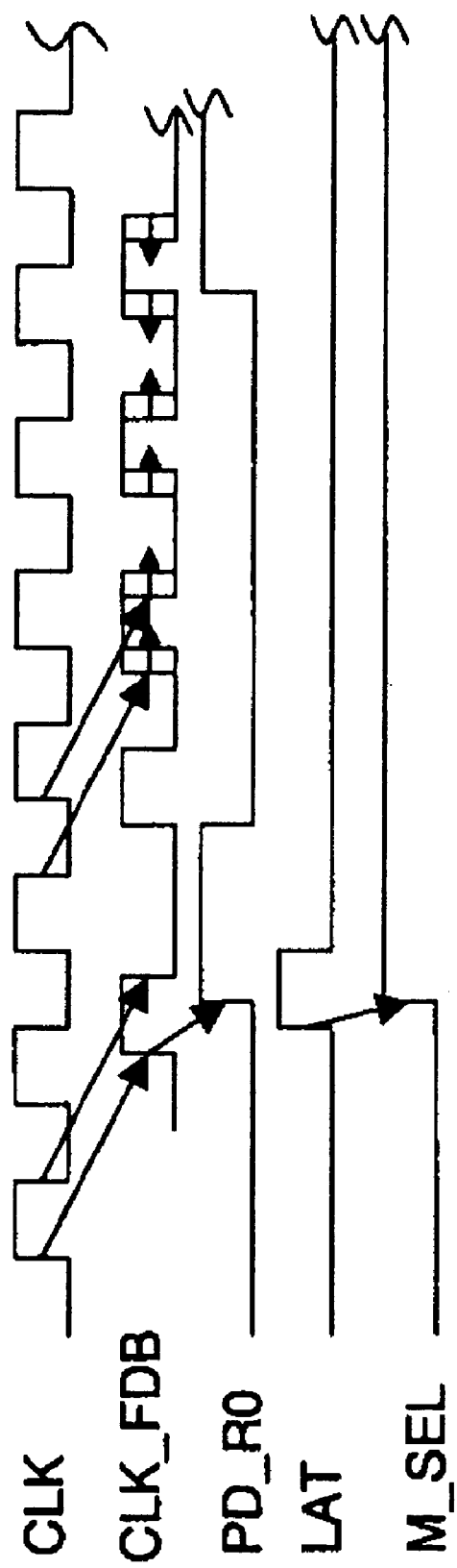
FIG. 13 is a timing diagram for illustrating the operation of the 1.5T mode in the second embodiment of the DLL according to the present invention.

FIGS. 12 and 13 are timing diagrams for illustrating the operation of the embodiment shown in FIG. 8. FIG. 12 is a timing chart showing the operation when the mode decision signal M_SEL is Low. The operation corresponds to the 1T mode operation explained with reference to FIG. 3A.

The 1T mode operation of the present embodiment is now explained with reference to FIGS. 12 and 8. During the beginning time of the operation (initializing operation), the clock signal CLK_FDB is generated with a delay proper to the circuit as from the clock signal CLK. The first phase detector 12$_1$ compares the phase of the rising edge of the clock signal CLK_FDB to the phase of the clock signal CLK and, if, with the first phase comparison result signal PD_R0, the phase of the clock signal CLK_FDB lags or leads the phase of the clock signal CLK, a High level and a Low level are output as the phase comparison result signal PD_R0, respectively.

In the initializing operation of the DLL operation, the mode latch signal LAT is output as a one-shot pulse. The mode decision circuit 91 latches the first phase comparison result signal PD_R0 to output the mode decision signal M_SEL.

In the example of FIG. 12, the first phase comparison result signal PD_R0 is Low when the mode latch signal LAT is output (when the one-shot pulse rises). That is, referring to FIG. 12, the clock signal CLK_FDB, fed back to the first phase detector 12$_1$ rises ahead of the rise timing of the clock signal of the next cycle to cycle of the clock signal CLK with which the rising edge of the clock signal CLK_FDB was formed. Thus, the first phase detector 12$_1$ outputs the Low level as the first phase comparison result signal PD_R0. Hence, the mode decision circuit 91, which samples the first phase comparison result signal PD_R0 with the rising edge of the mode latch signal LAT, outputs a Low level as the mode decision signal M_SEL to realize the 1T mode. With the 1T mode, the selector 90 outputs the first phase comparison result signal PD_R0 and the second phase comparison result signal PD_F0 to the first counter (R) 13$_1$ and to the second counter (R) 13$_2$, respectively.

A control signal from the first CDL(F) 10$_1$, the delay time of which is set variably, based on the control signal from the first counter (R) 13$_1$, has its delay value controlled so that the rising of the feedback clock signal CLK_FDB is in phase with the rising of the input clock signal CLK. A control signal from the second CDL(F) 10$_2$, the delay time of which is set variably, based on the control signal from the second counter (F) 13$_2$, has its delay value controlled so that the fall of the feedback clock signal CLK_FDB is in phase with the fall of the input clock signal CLK.

The first FDL(F) 15$_1$ outputs an output signal CLK_R, with the finely adjusted rising phase, based on the phase difference between the rising edges of the two signals O0_R and E0_R, output from the first CDL(F) 10$_1$.

The second FDL(F) 15$_2$ outputs an output signal CLK_F, with the finely adjusted rising phase, based on the phase difference between the rising edges of the two signals O0_F and E0_F, output from the second CDL(F) 10$_2$.

The multiplexer circuit 92 performs switching control so that the rise timing of the clock signal CLK_R, delay-adjusted by the first FDL(F) 15$_1$, will be used for the rising of the clock signal CLK_0, and so that the rise timing of the clock signal CLK_F, delay-adjusted by the second FDL(F) 15$_2$, will be used for the fall of the clock signal CLK_0. The delay value is adjusted by the first CDL(F) 10 so that the falling edge of the feedback clock signal CLK_FDB, fed back to the phase detector 12$_1$, will be coincident with the rising edge of e.g. the next cycle clock signal CLK in the 1T mode, and so that the falling edge of the feedback clock signal CLK_FDB will be coincident with the falling edge of e.g. the second next cycle clock signal CLK in the 1T mode.

FIG. 13 is a timing chart illustrating the operation of the circuit of FIG. 8 in which the mode decision signal M_SEL is at a High level. This operation is the 1.5T operation explained with reference to FIG. 3C. The period of the clock signal CLK is shorter than that for the 1T mode shown in FIG. 12. Referring to FIGS. 13 and 8, the operation for the 1.5T mode in the present embodiment is explained.

As in the 1T mode, the mode latch signal LAT is output only once during e.g. the initializing operation of the DLL circuit. The mode decision circuit 91 latches the first phase comparison result signal PD_R0 to output the mode decision signal M_SEL.

In this case, the first phase comparison result signal PD_R0 is in a High level during e.g. the initializing operation of the DLL circuit. That is, since the clock signal period is shorter, as shown in FIG. 13, the feedback clock signal CLK_FDB, fed back to the phase detector 12$_1$, rises with a lag as from the rising of the input clock signal CLK of the clock cycle next following the cycle of the input clock signal CLK by which the clock signal CLK_FDB was formed. The phase comparison result signal PD_R0 is at a High level, and the mode decision circuit 91 outputs a High level as a mode decision signal M_SEL to set up the 1.5T mode.

In the 1.5T mode, the selector 90 is switched so that the first phase comparison result signal PD_R0 and the second phase comparison result signal PD_F0 will be output to the second counter 13$_2$ and to the first counter 13$_1$, based on the mode decision signal M_SEL of the High level, respectively.

Based on the control signal, output from the first counter 13$_1$ (R), the CDL (R) 10$_1$ $_{has}$ its delay time controlled so that the fall of the feedback clock signal CLK_FDB will be in phase with the rise of the clock signal CLK. Based on the control signal, output from the first counter 13$_1$ (R), the CDL (F) 10$_2$ $_{has}$ its delay time controlled so that the rising of the feedback clock signal CLK_FDB will be in phase with the fall of the clock signal CLK. That is, in the 1.5T mode, the first counter 13$_1$ (R) varies the delay time of the first CDL 10$_1$ (R), based on the second phase comparison result signal PD_F0 from the second phase detector 12$_2$, detecting the falling phase difference between the feedback clock signal CLK_FDB and the input clock signal CLK, while the second counter 13$_2$ (F) varies the delay time of the second CDL 102 (F), based on the first phase comparison result signal PD_R0 from the first phase detector 12$_1$, adapted for detecting the rising phase difference between the feedback clock signal CLK_FDB and the input clock signal CLK.

The multiplexer circuit 92 generates the rising edge of the clock signal CLK_0, using the clock signal CLK_F, delay-adjusted by the FDL15$_2$ (F), while generating the falling edge of the clock signal CLK_0, using the clock signal CLK_R, delay-adjusted by the first FDL15$_1$ (R).

The fall timing of the output clock signal CLK_0 is adjusted by the first CDL10$_1$ (R) and the first FDL 15$_1$ (R), while the rise timing of the output clock signal CLK_0 is adjusted by the second CDL 10$_2$ (F) and the second FDL 15$_2$ (R). The first CDL10$_1$ (R) has a delay value set based on the output PD_F0 of the second phase detector 12$_2$ (result of falling edge phase detection of the input clock signal CLK and the feedback clock signal CLK_FDB), while the second CDL10$_2$ (F) has a delay value set based on the output PD_R0 of the first phase detector 12$_1$ (result of rising edge phase detection of the input clock signal CLK and the feedback clock signal CLK_FDB).

In the present embodiment, as compared to the conventional semiconductor storage device, providing only the 1T mode or the 2T mode, the delay length from the fall of the clock signal CLK until the rising of the feedback clock signal CLK_FDB may be shorter by one-half clock cycle, by the 1T mode, as shown in FIG. 13, thereby reducing the delay variation caused by noise, that is, jitter.

In the mode decision circuit 91, shown in FIG. 11, a mode decision is executed, using only the phase comparison result signal PD_R0, in order to realize the least functions. However, the mode decision circuit 91 is, of course, not limited to this configuration. The mode decision circuit 91 may be configured for latching the logical sum of the first phase comparison result signal PD_R0 and the second phase comparison result signal PD_F0. Or, the mode decision circuit 91 may be configured for executing the mode decision by carrying out preset logical calculations of the first phase comparison result signal PD_R0 and the second phase comparison result signal PD_F0 with other control signals.

FIG. 14 shows the configuration of another embodiment of the DLL circuit according to the present invention. The present embodiment, shown in FIG. 14, includes a duty ratio detection circuit 93 (DCC), in addition to the structure of the embodiment shown in FIG. 8.

The duty ratio detection circuit 93 (DCC) receives the feedback clock signal CLK_FDB to detect the duty ratio to output a duty ratio detection signal PD_DCC to a selector 90*a*.

The selector 90*a* is controlled by the mode decision signal M_SEL and by an input DCC enable signal DCCen, which validates the result of duty ratio detection, and selects two signals from the first phase comparison result signal PD_R0, second phase comparison result signal PD_F0 and the detection signal PD_DCC, to transmit the selected signals to the first counter 13$_1$ (R) and the second counter 13$_2$ (F).

Figure 15:
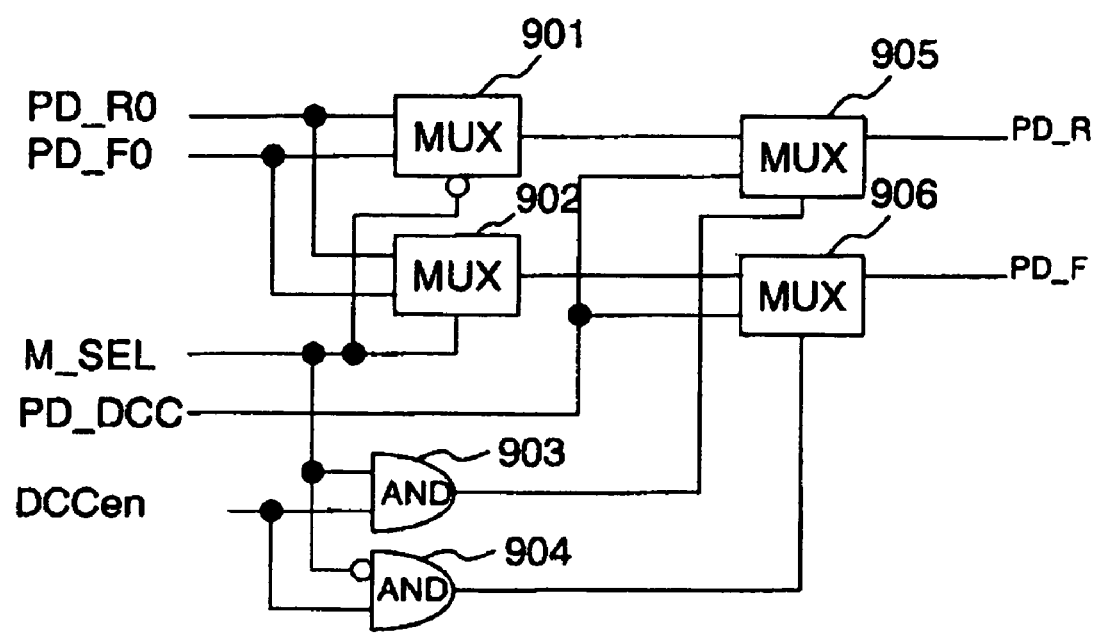
FIG. 15 is a diagram showing the configuration of a selector in the third embodiment of the DLL according to the present invention.

FIG. 15 shows the configuration of the selector 90*a* shown in FIG. 14. Referring to FIG. 15, the selector 90*a* includes two multiplexers 901, 902, supplied at first and second input terminals thereof with the first and second phase comparison result signal PD_R0 and PD_F0. The multiplexers 901 and 902 select and output PD_R0 and PD_F0 when the mode decision signal M_SEL is at a Low level. The selector 90*a* further include an AND circuit 903 which receives the mode decision signal M_SEL and the DCC enable signal DCCen, an AND circuit 904 which receives an inverted version of the mode decision signal M_SEL and the DCC enable signal DCCen, a multiplexer 905 which has first and second input terminals supplied with an output of the multiplexer 901 and with the duty ratio detection signal PD_DCC, and a multiplexer 906 which has first and second input terminals supplied with an output of the multiplexer 902 and with the duty ratio detection signal PD_DCC.

Figure 16:
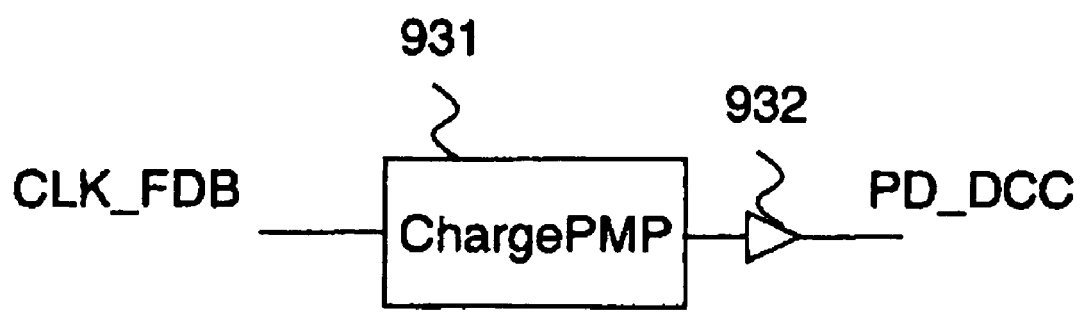
FIG. 16 is a diagram showing the configuration of a duty ratio detection circuit in the third embodiment of the DLL according to the present invention.

FIG. 16 shows the configuration of the duty ratio detection circuit DCC 93 of FIG. 14. Referring to FIG. 16, the duty ratio detection circuit DCC 93 includes a charge pump circuit 931 and a comparator circuit 932. The charge pump circuit 931 charges a capacitance, not shown (such as an internal node, e.g. a gate capacitance) during the High level period of the feedback clock signal CLK_FDB, and discharges the capacitance during the Low level period thereof. The comparator circuit 932 compares the terminal voltage of the capacitance of the charge pump circuit 931 to a preset reference voltage and outputs the result on which voltage is higher as a duty ratio detection signal PC_DCC. As an alternative structure of the duty ratio detection circuit DCC 93, the detection circuit may be configured for discharging (charging) a first capacitance (such as an internal node, e.g. a gate capacitance) during the High level period of the feedback clock signal CLK_FDB, discharging (charging) a second capacitance of the same capacitance value as the first capacitance during the Low level period of the feedback clock signal CLK_FDB, verifying which of the two capacitances is at a High level and outputting the duty ratio detection signal PD_DCC. Of course, the duty ratio detection circuit DCC 93 may be formed using any other suitable known circuits.

When the DCC enable signal DCCen and the mode decision signal M_SEL are at High levels (1.5T mode), the multiplexer 905 selects the PD_DCC and, otherwise, the multiplexer 906 selects an output of the multiplexer 901.

When the DCC enable signal DCCen is at a High level and the mode decision signal M_SEL is at a Low level, the multiplexer 906 selects the PD_DCC and, otherwise, a fourth multiplexer 909 selects an output of the multiplexer 902.

If, in the present embodiment, the DCC enable signal DCCen is at a Low level and the duty ratio detection circuit DCC 93 is inactivated, the selector 90*a* directly issues outputs of the multiplexers 901 and 902 as signals PD_R and PD_F, as in the selector 90 shown in FIG. 9. The operation is similar to that of the embodiment explained with reference to FIG. 8.

If, in the present embodiment, the duty ratio detection circuit DCC 93 is used, that is, if the DCC enable signal DCCen is High, duty correction may be carried out automatically by making adjustment for phase-matching the rising edge of the feedback clock signal CLK_FDB to the rising edge of the clock signal CLK, and by employing the duty ratio detection signal PD_DCC for the fall of the clock signal CLK.

For duty ratio correction, the falling edge of the feedback clock signal CLK_FDB may be phase-matched to the falling edge of the clock signal CLK-FDB, and the duty ratio detection signal PD_DCC may be used for the rising edge of the clock signal CLK.

In the conventional DDR memory, the clock signal CLK_FDB is phase-matched to both the rise and falling edges of the clock signal CLK.

However, if the operation at a still higher speed is needed, it may possibly become difficult to control the duty ratio of the clock signal CLK, and hence the duty ratio correcting function is needed.

The operation of the present embodiment will now be described. The operation for a case where the DCC enable signal DCCen is at a Low level is the same as the operation of the embodiment shown in FIG. 8. That is, in the selector 90*a* of FIG. 15, the outputs of the AND circuits 903 and 904 are Low, with the operation of the selector being the same as that of the selector 90 of FIG. 9.

When the DCC enable signal DCCen is Low and the mode decision signal M_SEL is Low (1T mode), the first phase comparison result signal PD_R0 and the second phase comparison result signal PD_F0 are used for controlling the first CDL10$_1$ (R) and the second CDL10$_2$ (F), respectively. The rise timing of the feedback clock signal CLK_FDB is adjusted by the first CDL10$_1$ (R), and the fall timing of the feedback clock signal CLK_FDB is adjusted by the second CDL10$_2$ (F).

When the DCC enable signal DCCen is Low and the mode decision signal M_SEL is High (1.5T mode), the second phase comparison result signal PD_F0 and the first phase comparison result signal PD_R0 are used for controlling the first CDL10$_1$ (R) and the second CDL10$_2$ (F), respectively. The rise timing of the feedback clock signal CLK_FDB is adjusted by the second CDL10$_2$ (F), which delays the fall of the input clock signal CLK, while the fall timing of the clock signal CLK_FDB is adjusted by the first CDL10$_1$, (R), which delays the rising of the input clock signal CLK.

When the DCC enable signal DCCen is High and the mode decision signal M_SEL is Low (1T mode), an output of the AND circuit 903 is Low and the output of the AND circuit 904 is High. The multiplexer 905 issues an output of the multiplexer 901, that is, the first phase comparison result signal PD_R0, as output signal PD_R, while the multiplexer 906 issues PD_DCC as output signal PD_F. That is, the first phase comparison result signal PD_R0 is used for controlling the first CDL10$_1$ (R), while the duty ratio detection signal PD_DCC is used for controlling the second CDL10$_2$ (F). The rise timing of the clock signal CLK_FDB is adjusted by the first CDL10$_1$, (R), while the fall timing of the clock signal CLK_FDB is adjusted by the second CDL10$_2$ (F).

When the DCC enable signal DCCen is High and the mode decision signal M_SEL is High (1.5T mode), an output of the AND circuit 903 is High and the output of the AND circuit 904 is Low. The multiplexer 905 issues PD_DCC, as output signal PD_R, while the multiplexer 906 issues an output of the multiplexer 902, that is, the first phase comparison result signal PD_R0, as output signal PD_F. That is, the duty ratio detection signal PD_DCC is used for controlling the first CDL10$_1$ (R), while the first phase comparison result signal PD_R0 is used for controlling the second CDL10$_2$ (F). The rise timing of the feedback clock signal CLK_FDB is adjusted by the first CDL10$_1$ (R), while the fall timing of the clock signal CLK_FD is adjusted by the first CDL10$_1$ (R).

By the above control, the operation of the 1T mode and the 1.5T mode may be realized even in case of addition of the duty ratio adjustment function by the duty ratio detection circuit DCC 93.

Figure 17:
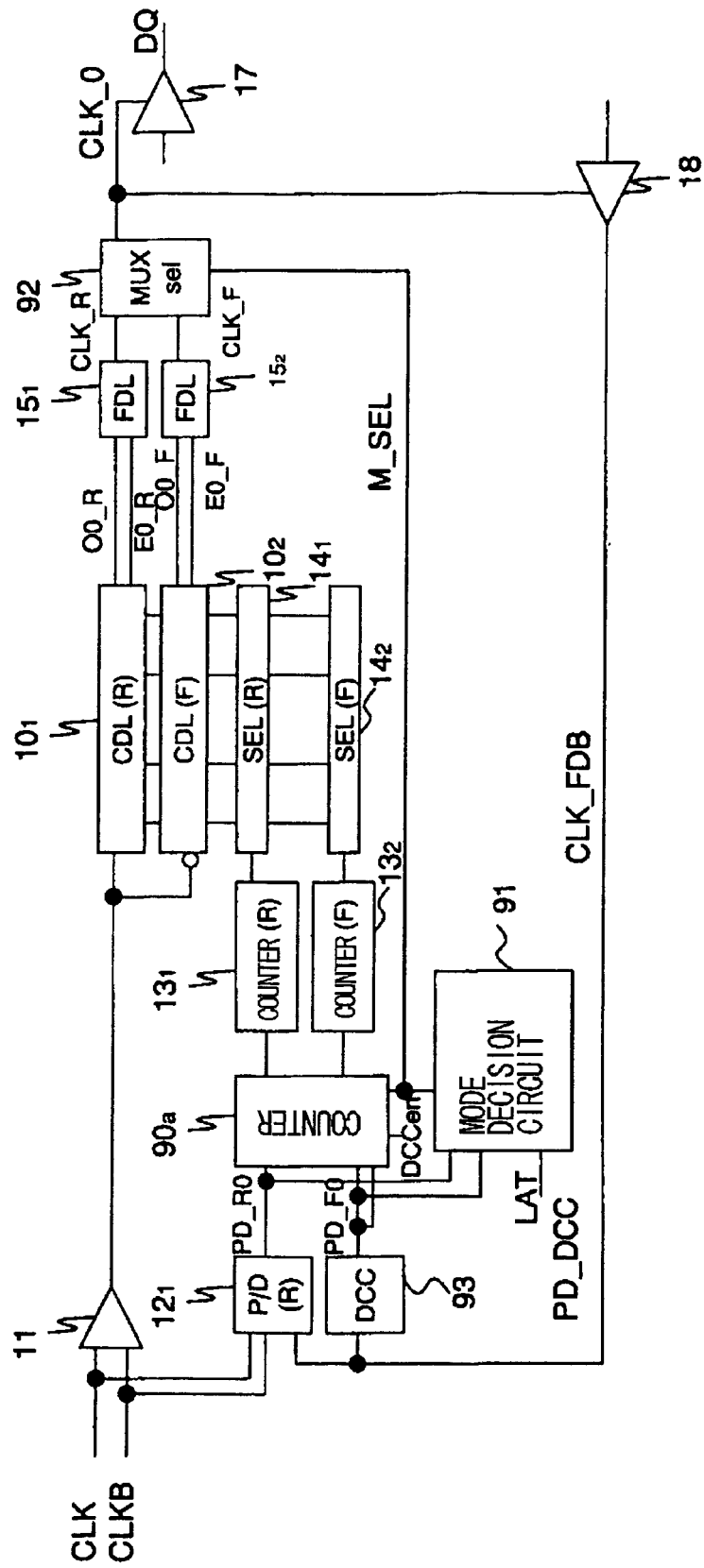
FIG. 17 is a diagram showing the configuration of a fourth embodiment of the DLL of the present invention.

In FIG. 17, the second phase detector 12$_2$ is omitted from the structure of FIG. 14, and the duty ratio detection signal PD_DCC from the duty ratio detection circuit DCC 93 is used for adjusting the rising.

The structure shown in FIGS. 14 and 15 is changed to a structure in which the duty ratio detection signal PD_DCC is connected to an input terminal PD_F0 of the selector 90*a*, whereby the operation similar to that when the DCCen is High at all times is achieved. The operation of the present embodiment is similar to that of the above embodiment, explained with reference to FIGS. 14 and 15, in which DCCen is at High level.

FIG. 18 shows the configuration of a further embodiment of the present invention. In the present embodiment, the selector 90*a*, used in the previous embodiment, is omitted, the output level of phase detectors 94$_1$, 94$_2$ is adapted to be reversible, the feedback clock signal CLK_FDB, as the subject of comparison, is also adapted to be reversible, and which of the rising and the fall of the clock signal is to be the other subject of comparison may be selectable by the mode decision signal M_SEL.

Figure 19:
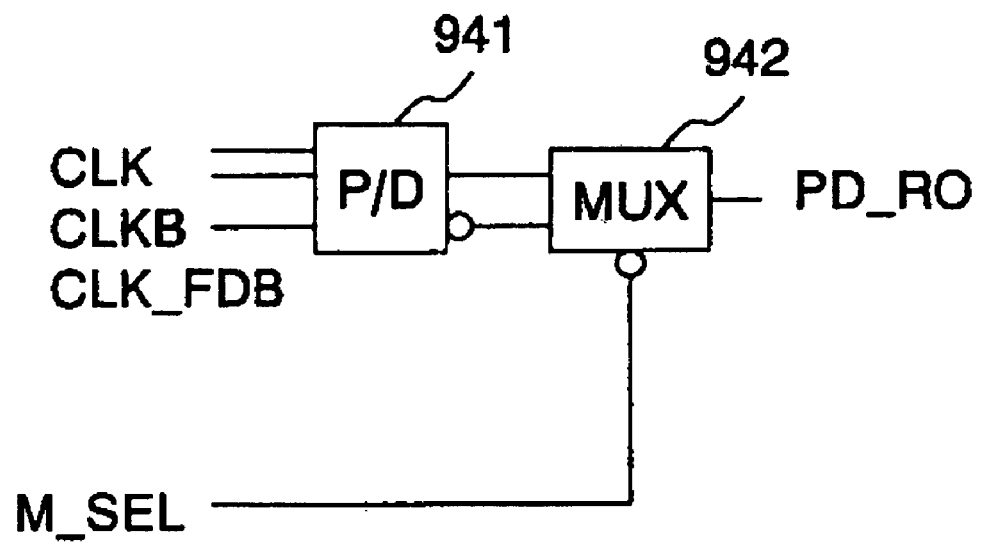
FIG. 19 is a diagram showing the configuration of a phase detector in the fifth embodiment of the DLL of the present invention.

FIG. 19 shows the configuration of the first phase detector 94$_1$ of FIG. 18. Referring to FIG. 19, the first phase detector 94$_1$ includes a phase detector 941 for detecting the phase difference between the input clock signal CLK and the feedback clock signal CLK_FDB to output complementary (i.e. non-inverted and inverted) phase comparison detection signals, and a multiplexer 942 for selecting one of the non-inverted and inverted phase comparison detection signals, output from the phase detector 941, by the mode decision signal M_SEL, to output the selected signal as the phase comparison result signal PD_R0. The structure of the second phase detectors 94$_2$ is similar to that of the first detector described above. However, the second phase detectors 94$_2$ receives an inverted version of the feedback clock signal CLK_FDB, and outputs the phase comparison result signal PD_F0.

When the mode decision signal M_SEL is at Low level, the first and second phase detectors 94$_1$, 94$_2$ output non-inverted phase comparison result signals as PD_R0 and PD_F0, respectively. When the mode decision signal M_SEL is at High level, the first and second phase detectors 94$_1$, 94$_2$ output inverted phase comparison result signals as PD_R0 and PD_F0, respectively.

Figure 20:
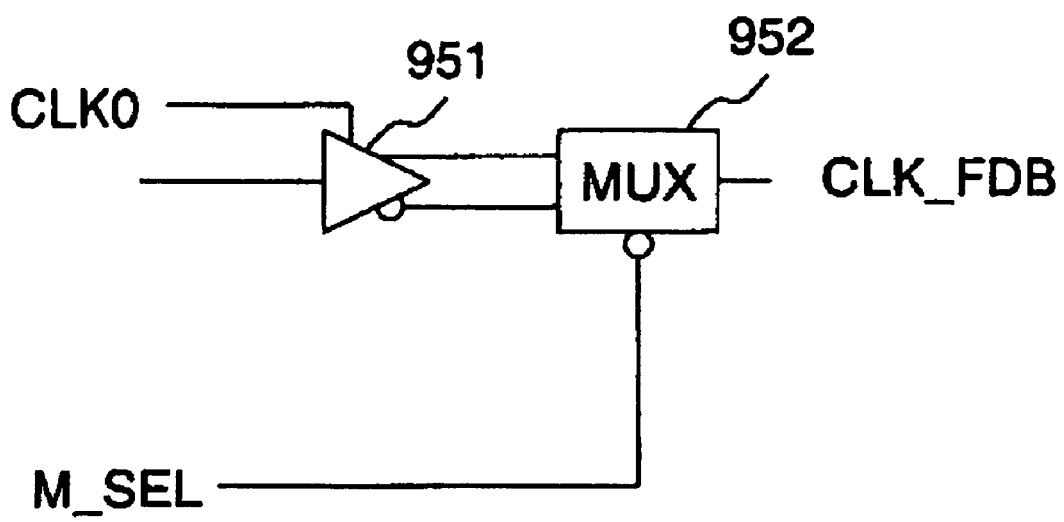
FIG. 20 is a diagram showing the configuration of a dummy circuit (BUF-SW) in the fifth embodiment of the DLL of the present invention.
Figure 21:
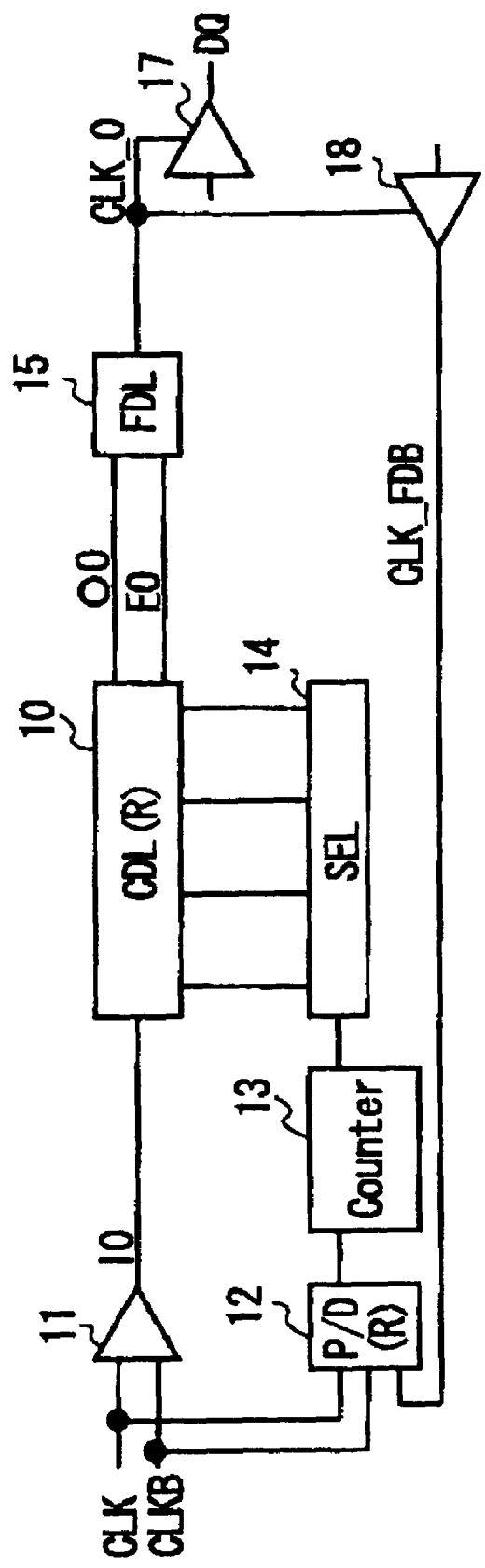
FIG. 21 is a diagram showing the configuration of a conventional DLL (synchronous delay loop).

FIG. 20 shows the configuration of a dummy circuit 95 (a buffer and a switch circuit). By the edge of the clock signal CLK0, a buffer circuit 951 generates rise and fall signals. The multiplexer 952 selects one of these signals by the mode decision signal M_SEL. When the mode decision signal M_SEL is Low, the multiplexer 952 selects the rising edge to output it as a signal CLK_FDB and, when the mode decision signal M_SEL is Low, the multiplexer 952 selects the falling edge to output it as a signal CLK_FDB When the mode decision signal M_SEL is Low, the first and second phase detectors $94_1$ and $94_2$ output the rising edge phase comparison result signal PD_R0 of phase comparison of the clock signal CLK and the feedback clock signal CLK_FDB and the falling edge phase comparison result signal PD_F0 of phase comparison of the clock signal CLK and the feedback clock signal CLK_FDB, to the first and second counters $13_1$, and $13_2$, respectively. The first and second counters $13_1$, $13_2$ adjust the delay time of the first and second $CDL10_1$ (R) and $CDL10_2$ (F). The multiplexer circuit 92 outputs a signal CLK_0, the rising and the fall of which are prescribed by a signal corresponding to the input clock signal CLK the rising and falling edges of which have been delay-adjusted by the first $CDL10_1$ and the second $CDL10_2$ and by the first $FDL15_1$ and the second $FDL15_2$. The buffer switch 95, forming a dummy circuit of the input and output buffers, outputs a signal CLK_FBD which rises with the rising edge of the signal CLK_0 when the mode decision signal M_SEL is at low level.

With the mode decision signal M_SEL at a High level, the first and second phase detectors $94_1$ and $94_2$ respectively output to the first and second counters $13_1$ and $13_2$ an inverted version PD_R0 of the phase comparison result signal of the rising edges of the clock signal CLK and the feedback clock signal CLK_FDB and an inverted version PD_F0 of the phase comparison result signal of the falling edges of the clock signal CLK and the feedback clock signal CLK_FDB. The delay values of the rising and falling edges of the first $CDL10_1$ and the second $CDL10_2$ are adjusted based on count values of the first and second counters $13_1$ and $13_2$.

The multiplexer circuit 92 outputs an output clock signal CLK_0 which rises based on the falling edge of the input clock signal CLK (output of the second FDL $15_2$) and which falls based on the rising edge of the input clock signal CLK (output of the second FDL $15_1$).

The buffer switch 95, constituting a dummy circuit for compensating the delay time of e.g. the input buffer 11 or the output buffer 17 of the DLL circuit in a feedback loop of the DLL circuit, selects an inverted output of the buffer 951 when the mode decision signal M_SEL is High, and outputs, as the feedback clock signal CLK_FDB, a signal which falls with the rising edge of the output clock signal CLK_0 and which rises with the falling edge of the output clock signal CLK_0. The feedback clock signal CLK_FDB is antiphase with respect to the output clock signal CLK_0, the rising and the fall of which are prescribed by the fall and the rising of the input clock signal.

By the above-described structure, the mode in which the delay value in the first $CDL10_1$ (R) is adjusted so that the rising edge of the feedback clock signal CLK_FDB is coincident with the rising phase of the input clock signal CLK and the delay value in the second $CDL10_2$ (F) is adjusted so that the falling phase of the feedback clock signal CLK_FDB is coincident with the falling phase of the input clock signal CLK, is switched to the mode in which the delay value in the second $CDL10_2$ (F) is adjusted so that the rising edge of the feedback clock signal CLK_FDB is coincident with the falling edge of the input clock signal CLK and the delay value in the first $CDL10_1$ (R) is adjusted so that the falling edge of the feedback clock signal CLK_FDB (generated based on the rising of the output clock signal CLK_0) is coincident with the rising phase of the input clock signal CLK, and vice versa.

Although the present invention has so far been explained with reference to the above-described embodiments, it is to be noted that the present invention comprises a variety of modifications or corrections, without being limited to the particular structure of the above-described embodiments.

According to the present invention, the delay time of the rising and fall transition edges of an output signal as from the corresponding transition edges of an input signal may be variably set, by a simplified structure, whereby the increase in the power consumption or the circuit size may be reduced to a minimum. According to the present invention, low jitter and a small area may be realized in the development of a high-speed synchronous semiconductor storage device, such as DDRII/I-SDRAM.

Moreover, according to the present invention, the 1T mode may be switched to the 1.5T mode and vice versa with a sole DLL circuit by a simplified structure.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A delay circuit comprising:
   a first delay line circuit having a plurality of stages of delay units;
   a second delay line circuit having a plurality of stages of delay units;
   a plurality of transfer circuits provided in association with respective stages of the delay units of said first delay line circuit, said transfer circuits respectively receiving outputs of said stages of the delay units of said first delay line circuit to control the transfer of the outputs of said delay units to associated stages of the delay units of said second delay line circuit;
   said delay unit of each stage of said first delay line circuit inverting a signal supplied to said delay units and outputting the inverted signal;
   the delay unit of each stage of said second delay line circuit, including a logic circuit receiving an output signal of the transfer circuit associated with the delay unit and an output signal of a preceding stage and outputting the result of logical operation of the input signals to a following stage,
   one of a plurality of the transfer circuits, receiving respective outputs of odd-numbered stages of delay units of said first delay line circuit, is selected by a corresponding control signal;
   one of a plurality of transfer circuits, receiving respective outputs of even-numbered stages of delay units of said first delay line circuit, is selected by a corresponding control signal; and
   the rise timing and the fall timing of an output signal of said second delay line circuit are variably set with respect to the rising and fall of the signal supplied to said first delay line circuit.

2. A signal generating device comprising the delay circuit according to claim 1, wherein the rising and falling edges of the output signal are varied independently relative to the rising and falling of the input signal.

3. A delay circuit comprising:
   a first delay line circuit having a plurality of stages of delay units;

a second delay line circuit having a plurality of stages of delay units;
a plurality of transfer circuits provided in association with respective stages of the delay units of said first delay line circuit, said transfer circuits respectively receiving outputs of said stages of the delay units of said first delay line circuit to control the transfer of the outputs of said delay units to associated stages of the delay units of said second delay line circuit;
said delay unit of each stage of said first delay line circuit inverting a signal supplied to said delay units and outputting the inverted signal;
the delay unit of each stage of said second delay line circuit, including a logic circuit receiving an output signal of the transfer circuit associated with the delay unit and an output signal of a preceding stage and outputting the result of logical operation of the input signals to a following stage,
in case the control signal supplied to the transfer circuit associated with a given one of the even-numbered stages and to the transfer circuit associated with a given one of the odd-numbered stages is activated, the control signals supplied to respective transfer circuits downstream of said transfer circuit are activated.

4. A delay circuit comprising:
a first delay line circuit having a plurality of stages of delay units;
a second delay line circuit having a plurality of stages of delay units;
a third delay line circuit having a plurality of stages of delay units;
a first set of plurality of transfer circuits provided in association with respective stages of the delay units of said first delay line circuit, said transfer circuits controlling the transfer of the outputs of said respective stages of delay units of said first delay line circuit to associated stages of the delay units of said second delay line circuit based on respective input control signals; and
a second set of plurality of transfer circuits provided in association with respective stages of the delay units of said first delay line circuit, said transfer circuits controlling the transfer of the outputs of the respective stages of said delay units of said first delay line circuit to associated stages of the delay units of said third delay line circuit based on respective input control signals;
the delay unit of each stage of said first delay line circuit inverting a signal supplied to said delay unit to output the resultant inverted signal;
the delay unit of each stage of said second delay line circuit including a logic circuit receiving an output signal of the transfer circuit of the first set of transfer circuits associated with said delay unit and an output signal of a preceding stage to output the result of the logical operation on the input signals to a following stage;
the delay unit of each stage of said third delay line circuit including a logic circuit receiving an output signal of the transfer circuit of the second set of transfer circuits associated with said delay unit and an output signal of a preceding stage to output the result of the logical operation on the input signals to a following stage.

5. A delay locked loop device comprising:
a first delay line circuit receiving an input clock signal;
a second delay line circuit for performing fine phase adjustment of an output signal based on the rising of the clock signal output from said first delay line circuit;
a third delay circuit for performing fine phase adjustment of an output signal based on the falling of the clock signal output from said first delay line circuit;
a multiplexing circuit receiving an output signal of said second delay line circuit and an output signal of said third delay circuit and outputting an output clock signal multiplexed from said two output signals supplied thereto;
a first phase detection circuit receiving said input clock signal and an output clock signal of said multiplexing circuit to detect the phase difference of the rising edges thereof;
a second phase detection circuit receiving said input clock signal and an output clock signal of said multiplexing circuit to detect the phase difference of the falling edges thereof;
a first counter for counting the result of phase detection by said first phase detection circuit;
a second counter for counting the result of phase detection by said second phase detection circuit;
a first selection circuit for outputting a control signal for adjusting the rise timing in said first delay line circuit based on a count output of said first counter; and
a second selection circuit for outputting a control signal for adjusting the fall timing in said first delay line circuit based on a count output of said second counter; wherein
said first delay line circuit is a delay circuit comprising:
a plurality of stages of delay units;
a plurality of transfer circuits provided in association with respective stages of the delay units of said first delay line circuit, said transfer circuits respectively receiving outputs of said stages of the delay units of said first delay line circuit to control the transfer of the outputs of said delay units to associated stages of the delay units of said second delay line circuit;
said delay unit of each stage of said first delay line circuit inverting a signal supplied to said delay units and outputting the inverted signal.

6. The delay locked loop device according to claim 5, wherein
said first delay line circuit outputs a signal with plural rising edges of respective different phases, generated from said input signal, and another signal with plural falling edges of respective different phases, generated from an inverted version of said input signal.

7. A semiconductor storage device including the delay locked loop device as defined in claim 5, said semiconductor storage device comprising
a data multiplexer for selecting input parallel readout data for outputting a serial output, based on the rising and falling edges of a clock signal output from said data multiplexer, and an output buffer receiving the output of said multiplexer to output said output at a data output terminal thereof.

8. The semiconductor storage device according to claim 7, further comprising:
a dummy circuit of a delay time equivalent to the delay time of said data multiplexer; wherein
said dummy circuit receives an output clock signal from said multiplexer to output a feedback clock signal and wherein said feedback clock signal is supplied from said dummy circuit to said first and second phase detection circuits.

* * * * *